US008895116B2

(12) United States Patent
Tanaka

(10) Patent No.: US 8,895,116 B2
(45) Date of Patent: Nov. 25, 2014

(54) MANUFACTURING METHOD OF CRYSTALLINE SEMICONDUCTOR FILM AND MANUFACTURING METHOD OF SEMICONDUCTOR DEVICE

(75) Inventor: Tetsuhiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 402 days.

(21) Appl. No.: 13/283,809

(22) Filed: Oct. 28, 2011

(65) Prior Publication Data

US 2012/0115290 A1 May 10, 2012

(30) Foreign Application Priority Data

Nov. 4, 2010 (JP) .................. 2010-247300

(51) Int. Cl.

| *H05H 1/24* | (2006.01) |
| *C23C 16/509* | (2006.01) |
| *H01L 29/04* | (2006.01) |
| *H01J 37/32* | (2006.01) |
| *C23C 16/56* | (2006.01) |
| *H01L 29/786* | (2006.01) |
| *C23C 16/34* | (2006.01) |
| *C23C 16/455* | (2006.01) |
| *H01L 29/66* | (2006.01) |
| *C23C 16/00* | (2006.01) |

(52) U.S. Cl.
CPC ...... *H01L 29/78696* (2013.01); *C23C 16/5096* (2013.01); *H01L 29/04* (2013.01); *H01J 37/32449* (2013.01); *C23C 16/56* (2013.01); *H01L 29/78675* (2013.01); *C23C 16/345* (2013.01); *H01J 37/32018* (2013.01); *C23C 16/45565* (2013.01); *H01L 29/66757* (2013.01); *H01J 37/3244* (2013.01)
USPC ....................... 427/569; 427/248.1

(58) Field of Classification Search
USPC ............................... 427/569, 248.1
See application file for complete search history.

(56) References Cited

U.S. PATENT DOCUMENTS

| 4,647,512 A | 3/1987 | Venkataramanan et al. |
| 4,951,601 A | 8/1990 | Maydan et al. |
| 5,186,718 A | 2/1993 | Tepman et al. |
| 5,202,008 A | 4/1993 | Talieh et al. |

(Continued)

FOREIGN PATENT DOCUMENTS

| JP | 05-160035 | 6/1993 |
| JP | 07-230956 | 8/1995 |

(Continued)

*Primary Examiner* — Kelly M Gambetta
(74) *Attorney, Agent, or Firm* — Nixon Peabody LLP; Jeffrey L. Costellia

(57) ABSTRACT

The crystalline semiconductor film is formed following steps that supplying a film formation gas to a second gas diffusion area from a gas introduction port provided in an upper electrode; supplying the film formation gas to a first gas diffusion area from the second gas diffusion area through holes provided in a dispersion plate between the first gas diffusion area and the second gas diffusion area; supplying the film formation gas into a treatment room from the first gas diffusion area through holes in a shower plate between the first gas diffusion area and the treatment room; generating glow discharge plasma by supplying high frequency electricity from an electrode surface of the upper electrode; generating crystal nuclei on a substrate provided over a lower electrode facing the upper electrode; and growing the crystal nuclei. A portion of the dispersion plate which faces the gas introduction port has no hole.

22 Claims, 18 Drawing Sheets

(56) References Cited

U.S. PATENT DOCUMENTS

| | | | |
|---|---|---|---|
| 5,294,320 | A | 3/1994 | Somekh et al. |
| 5,308,417 | A | 5/1994 | Groechel et al. |
| 5,314,574 | A | 5/1994 | Takahashi |
| 5,352,294 | A | 10/1994 | White et al. |
| 5,366,585 | A | 11/1994 | Robertson et al. |
| 5,403,459 | A | 4/1995 | Guo |
| 5,486,235 | A | 1/1996 | Ye et al. |
| 5,589,233 | A | 12/1996 | Law et al. |
| 5,616,208 | A | 4/1997 | Lee |
| 5,709,757 | A | 1/1998 | Hatano et al. |
| 5,756,400 | A | 5/1998 | Ye et al. |
| 5,763,018 | A | 6/1998 | Sato |
| 5,779,803 | A | 7/1998 | Kurono et al. |
| 5,812,403 | A | 9/1998 | Fong et al. |
| 5,834,371 | A | 11/1998 | Ameen et al. |
| 5,868,849 | A | 2/1999 | Nakao |
| 5,879,574 | A | 3/1999 | Sivaramakrishnan et al. |
| 5,882,414 | A | 3/1999 | Fong et al. |
| 6,019,848 | A | 2/2000 | Frankel et al. |
| 6,060,397 | A | 5/2000 | Seamons et al. |
| 6,171,662 | B1 | 1/2001 | Nakao |
| 6,194,628 | B1 | 2/2001 | Pang et al. |
| 6,199,505 | B1 | 3/2001 | Sato et al. |
| 6,251,216 | B1 | 6/2001 | Okamura et al. |
| 6,283,060 | B1 | 9/2001 | Yamazaki et al. |
| 6,344,420 | B1 | 2/2002 | Miyajima et al. |
| 6,352,593 | B1 | 3/2002 | Brors et al. |
| 6,402,847 | B1 | 6/2002 | Takagi et al. |
| 6,444,037 | B1 | 9/2002 | Frankel et al. |
| 6,499,427 | B1 | 12/2002 | Yamazaki et al. |
| 6,984,595 | B1 | 1/2006 | Yamazaki |
| 7,329,608 | B2 | 2/2008 | Babayan et al. |
| 7,723,218 | B2 | 5/2010 | Yamazaki et al. |
| 7,842,586 | B2 | 11/2010 | Yamazaki |
| 2001/0004478 | A1 | 6/2001 | Zhao et al. |
| 2003/0205202 | A1* | 11/2003 | Funaki et al. ............. 118/723 E |
| 2008/0231617 | A1 | 9/2008 | Miyake et al. |
| 2008/0264337 | A1 | 10/2008 | Sano et al. |
| 2009/0047758 | A1 | 2/2009 | Yamazaki et al. |
| 2009/0137087 | A1 | 5/2009 | Yamazaki et al. |
| 2009/0137103 | A1 | 5/2009 | Yamazaki |
| 2009/0197012 | A1 | 8/2009 | Yamazaki et al. |
| 2010/0124804 | A1 | 5/2010 | Takahashi et al. |
| 2010/0216285 | A1 | 8/2010 | Yokoi et al. |
| 2010/0269896 | A1* | 10/2010 | Sheng et al. .................. 136/255 |
| 2011/0039402 | A1 | 2/2011 | Yamazaki et al. |
| 2011/0053357 | A1 | 3/2011 | Yamazaki |
| 2011/0056435 | A1 | 3/2011 | Yamazaki |
| 2011/0088847 | A1* | 4/2011 | Law et al. ................. 156/345.34 |
| 2012/0100309 | A1 | 4/2012 | Miyairi et al. |
| 2012/0115273 | A1 | 5/2012 | Tanaka et al. |

FOREIGN PATENT DOCUMENTS

| | | |
|---|---|---|
| JP | 11-297496 | 10/1999 |
| JP | 2000-269201 | 9/2000 |
| JP | 2000-277439 A | 10/2000 |
| JP | 2001-217424 | 8/2001 |
| JP | 2004-200345 | 7/2004 |

* cited by examiner

MANUFACTURING METHOD OF CRYSTALLINE SEMICONDUCTOR FILM AND MANUFACTURING METHOD OF SEMICONDUCTOR DEVICE

BACKGROUND OF THE INVENTION

1. Field of the Invention

The present invention relates to a manufacturing method of a crystalline semiconductor film and a manufacturing method of a semiconductor device.

2. Description of the Related Art

In recent years, semiconductor devices have been essential for our life. Here, the semiconductor devices refer to devices including at least one transistor and include a variety of electronic devices in its category. Thin film elements such as thin film transistors included in such semiconductor devices are manufactured by forming a thin film over a substrate and processing the thin film into a desired shape by etching or the like. Such a method for manufacturing a thin film element is applied to, for example, liquid crystal display devices (e.g., liquid crystal televisions).

However, when the current circumstances of moving images (e.g., watching movies and sports in 3D) are taken into account, clarity of moving images in a liquid crystal television using an amorphous silicon film is insufficient; therefore, thin film transistors which respond at high speed and have high carrier mobility are needed. For this reason, a microcrystalline silicon film has been developed. As a reference disclosing a thin film transistor using a microcrystalline silicon film, Patent Document 1 can be given, for example.

A variety of technologies have been developed for a plasma treatment apparatus so that the plasma treatment apparatus can be used for manufacturing an element such a transistor included in a semiconductor device (e.g., Patent Document 2).

REFERENCE

[Patent Document 1] Japanese Published Patent Application No. 2001-217424

[Patent Document 2] Japanese Published Patent Application No. H11-297496

SUMMARY OF THE INVENTION

A microcrystalline semiconductor film is formed of a plurality of crystal grains, and the carrier mobility of the microcrystalline semiconductor film can be improved by increasing the size of the crystal grains. Such crystal grains are formed as follows; first, crystal nuclei are generated, and then the crystal nuclei are grown. Therefore, in order to increase the size of the crystal grains, nuclei of the crystal grains need to be formed uniformly over a formation surface.

An object of one embodiment of the present invention is to provide a manufacturing method of a crystalline semiconductor film, by which crystal nuclei of crystal grains of a crystalline semiconductor film can be formed uniformly over a formation surface.

One embodiment of the present invention is a manufacturing method of a crystalline semiconductor film using a plasma CVD apparatus which can generate plasma with high uniformity. To enhance the uniformity of plasma, time average of electric field intensity between an upper electrode and a lower electrode, and distribution of gas introduced are preferably uniformed.

One embodiment of the present invention is a manufacturing method of a crystalline semiconductor film, including the steps of: supplying a film formation gas into a treatment room from a gas hole of a shower plate through a second gas diffusion area and a first gas diffusion area; setting the pressure of the treatment room to greater than or equal to 2000 Pa and less than or equal to 100000 Pa by introducing the film formation gas; generating glow discharge plasma by supplying high frequency electricity with uniform electric intensity from an electrode surface of one of a pair of electrodes which face each other and generate an electric field in the treatment room; and generating crystal nuclei on a substrate which is provided over the other electrode so that the crystal nuclei are grown later. The treatment room is separated from the first gas diffusion area by the shower plate. A dispersion plate is provided with no gas hole in a portion facing a gas pipe and diffuses the film formation gas introduced from the gas pipe. The first gas diffusion area is separated from the second gas diffusion area by the dispersion plate and receives the film formation gas introduced from the gas hole of the dispersion plate.

Note that in the manufacturing method of a crystalline semiconductor film of one embodiment of the present invention, there is no particular limitation on the condition of the treatment room as long as the glow discharge plasma is generated between the electrodes which face each other and the pressure in the treatment room is within the value described above.

A plasma treatment apparatus of the manufacturing method of a crystalline semiconductor film of one embodiment of the present invention may have a structure in which an upper electrode and a chamber wall which covers the upper electrode are on the same axis and gas introduced through a gas pipe in the upper electrode is introduced into a treatment room through a dispersion plate and a shower plate. The dispersion plate may include a center portion of the dispersion plate which faces the gas pipe in the upper electrode and which is provided with no gas hole and a peripheral portion of the dispersion plate which surrounds the center portion of the dispersion plate and which is provided with a plurality of gas holes.

A plasma CVD apparatus is used for the manufacturing method of a crystalline semiconductor film of one embodiment of the present invention. The plasma CVD apparatus includes a treatment room in which an electrode surface of an upper electrode and an electrode surface of a lower electrode face each other and which is covered with a chamber wall; and a line room which is separated from the treatment room by the upper electrode and an insulator and which is covered with the chamber wall. The treatment room is connected to a first gas diffusion area provided between a dispersion plate and a shower plate. The first gas diffusion area is connected to a second gas diffusion area provided between the dispersion plate and the electrode surface of the upper electrode. The second gas diffusion area is connected to a first gas pipe in the upper electrode. The first gas pipe in the upper electrode is connected to a second gas pipe. The second gas pipe is connected to a process gas supply source. The line room includes an inert gas introduction port, and the upper electrode and the chamber wall which are provided on the same axis. The dispersion plate includes a center portion of the dispersion plate, which is provided with no gas hole; and a peripheral portion of the dispersion plate, which is provided with a plurality of gas holes. The center portion of the dispersion plate faces a gas introduction port of the first gas pipe in the upper electrode, which is connected to the electrode surface of the upper electrode. The peripheral portion of the dispersion plate surrounds the center portion of the dispersion plate.

In the manufacturing method of a crystalline semiconductor film of one embodiment of the present invention, plasma treatment is preferably performed under a pressure of greater than or equal to 4000 Pa and less than or equal to 50000 Pa.

In the plasma CVD apparatus with the structure, the shower plate is preferably provided with a plurality of gas holes, and the number of gas holes of the shower plate is preferably larger than the number of gas holes of the dispersion plate. Alternatively, the shower plate is preferably provided with a plurality of gas holes, and the total area of the gas holes of the shower plate is preferably larger than the total area of the gas holes of the dispersion plate. This is because the gas can be diffused sufficiently uniformly in the first gas diffusion area.

In the plasma CVD apparatus with the structure, a thermometer is connected to the upper electrode, and a connecting portion of the thermometer in the upper electrode is preferably located to be symmetrical to the gas introduction port of the first gas pipe in the upper electrode with respect to the center point of the electrode surface of the upper electrode. This is because uniformity of an electric field from the upper electrode can be increased.

In the plasma CVD apparatus with the structure, the upper electrode is preferably provided with a path of a cooling medium which bypasses the vicinity of the gas introduction port of the first gas pipe in the upper electrode. As the cooling medium, for example, water, oil, or the like can be used.

One embodiment of the present invention is a manufacturing method of a semiconductor device, including the steps of forming a gate electrode, forming a gate insulating layer to cover the gate electrode, forming a crystalline semiconductor film over the gate insulating layer by the above manufacturing method of a crystalline semiconductor film, and forming a source electrode and a drain electrode over the crystalline semiconductor film.

Note that, in this specification, a "crystal grain" means a crystal which is included in a film, and a "crystal nucleus" means a crystal which does not have a film shape yet. That is, in this specification, the "crystal nucleus" refers to not only an initial nucleus which is to be a crystal grain, but also a minute crystal grain which is grown a little from a crystal nucleus.

According to one embodiment of the present invention, the crystal nuclei of crystal grains of a crystalline semiconductor film can be formed uniformly over a formation surface.

According to one embodiment of the present invention, the size of crystal grains of a crystalline semiconductor film can be increased, so that a crystalline semiconductor film with high carrier mobility can be obtained. Therefore, a semiconductor device with high field-effect mobility can be obtained.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Embodiment 1

In this embodiment, a manufacturing method of a crystalline semiconductor device of one embodiment of the present invention will be described.

Figure 1:
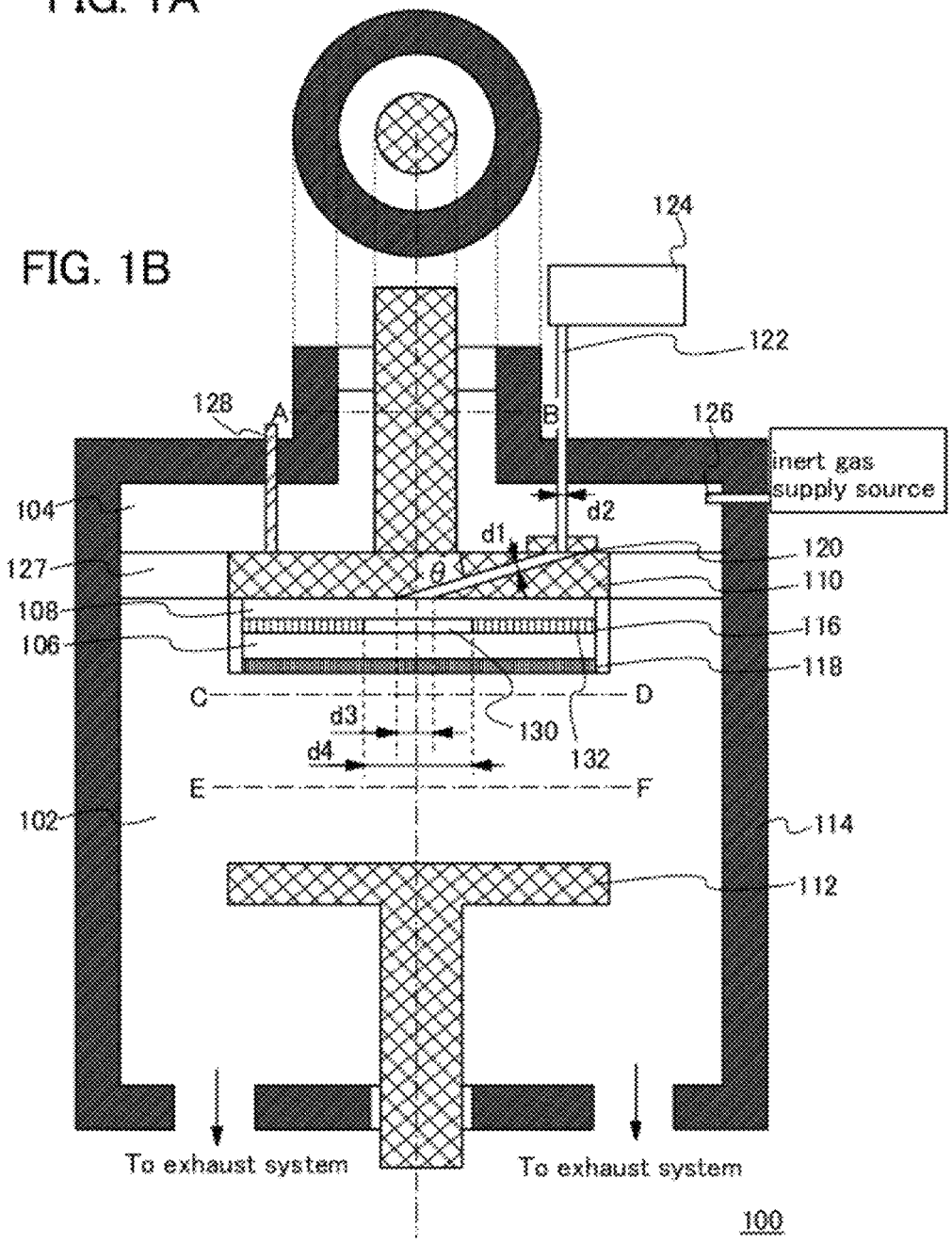
FIGS. 1A and 1B are schematic views of a plasma CVD apparatus for a manufacturing method of a crystalline semiconductor film of one embodiment of the present invention.

In a manufacturing method of a crystalline semiconductor device of one embodiment of the present invention, crystal nuclei are generated over a formation surface by plasma with high uniformity. A plasma CVD apparatus the schematic views of which are shown in FIGS. 1A and 1B is used at least for generating the crystal nuclei. FIG. 1B is a cross-sectional view of a main structure of a whole plasma treatment apparatus 100 and FIG. 1A is a cross-sectional view along line A-B in FIG. 1B.

The plasma treatment apparatus 100 illustrated in FIGS. 1A and 1B includes a treatment room 102 and a line room 104. The treatment room 102 is covered with a chamber wall 114. In the treatment room 102, an upper electrode 110 and a lower electrode 112 are provided so that their electrode surfaces face each other. The line room 104 is covered with the chamber wall 114 and is separated from the treatment room 102 by the upper electrode 110 and an insulator 127. A thermometer 128 is connected to the upper electrode 110.

The treatment room 102 is connected to a first gas diffusion area 106 provided between a dispersion plate 116 and a shower plate 118. The first gas diffusion area 106 is connected to a second gas diffusion area 108 provided between the dispersion plate 116 and the electrode surface of the upper electrode 110. The second gas diffusion area 108 is connected to a first gas pipe 120 in the upper electrode 110. The first gas pipe 120 in the upper electrode 110 is connected to a second gas pipe 122. The second gas pipe 122 is connected to a process gas supply source 124.

The line room 104 includes a gas introduction port 126 connected to an inert gas supply source, and the upper electrode 110 and the chamber wall 114 which are provided on the same axis. The line room 104 is preferably set to an inert gas atmosphere at a positive pressure.

Note that in this specification, an "atmosphere at a positive pressure" preferably means a pressure higher than the atmospheric pressure; however, it is not limited thereto. The "atmosphere at a positive pressure" is a pressure at least higher than the pressure in the treatment room.

When the inside of the line room 104 is set to an inert gas atmosphere at a positive pressure, oxidation or the like of components of the line room 104 is prevented, so that the frequency of maintenance can be reduced and mean time between failures (MTBF) can be increased.

Further, since in the plasma treatment apparatus illustrated in FIGS. 1A and 1B, the upper electrode 110 and the chamber wall 114 are on the same axis, a path for an introduced inert gas is not blocked. Therefore, in a line portion of the upper electrode 110, the uniformity of temperature distribution at the same height is increased and propagation of power on a surface of the line portion of the upper electrode in the case where power supplied to the upper electrode 110 has a high frequency can be stabilized. Accordingly, when the upper electrode 110 and the chamber wall 114 are on the same axis, impedance can be reduced and transmission efficiency can be increased. Moreover, the uniformity of the distribution of an electric field in the upper electrode 110 can be increased.

Here, when the diameter of the line portion of the upper electrode 110 is d, the diameter of the inside of the chamber wall 114 is D, and the dielectric constant of the atmosphere in the line room 104 is ∈, impedance Z is expressed by Formula 1.

$$Z = \frac{138}{\sqrt{\varepsilon}} \log_{10} \frac{D}{d}$$ [Formula 1]

According to the above Formula 1, when the dielectric constant ∈ is increased, the impedance Z can be reduced. Since gas introduced into the line room 104 can be selected as appropriate, the impedance Z can be reduced by selecting gas whose dielectric constant ∈ is high. For example, when the atmosphere of the line room 104 is a nitrogen atmosphere, the dielectric constant ∈ is about 5.47 at a temperature of 20° C. in the atmosphere of the line room 104. Alternatively, when the atmosphere of the line room 104 is an argon atmosphere, the dielectric constant ∈ is about 5.17 at a temperature of 20° C. in the atmosphere of the line room 104.

In addition, when the inside of the line room 104 is set to an inert gas atmosphere at a positive pressure, heat of components of the line room 104 can be reduced; therefore, for example, even in the case where the upper electrode 110 is provided with a heater, the upper electrode 110 can be prevented from overheating.

Further, when the inside of the line room 104 is set to an inert gas atmosphere at a positive pressure, entry of atmospheric components to the treatment room 102 can be suppressed even in the case where leakage occurs in the chamber wall 114.

Figure 2:
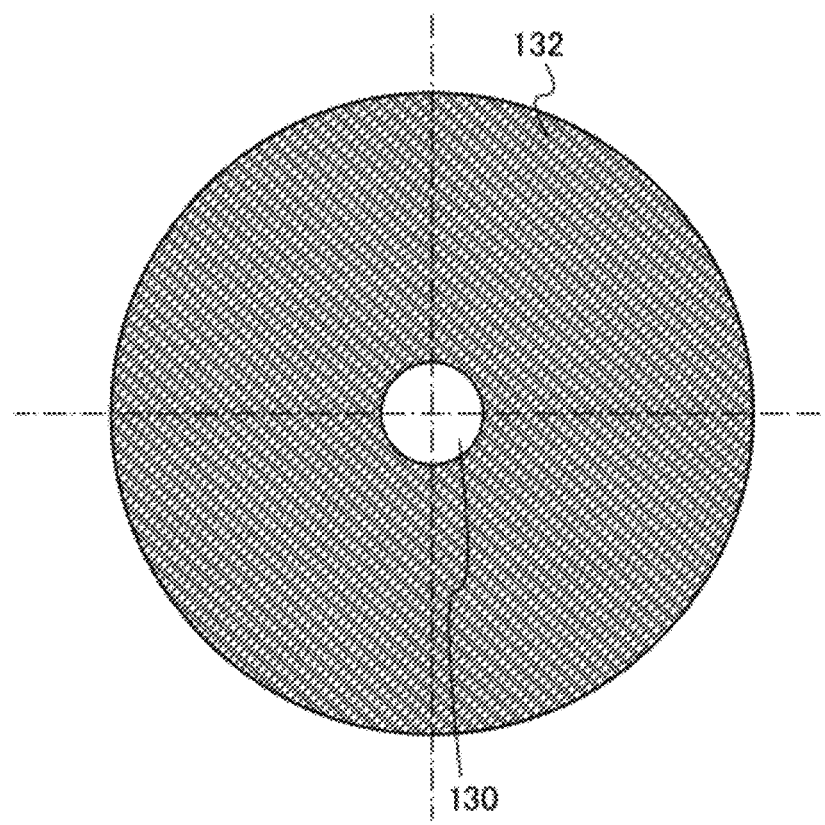
FIG. 2 is a schematic view of a dispersion plate of the plasma CVD apparatus in FIGS. 1A and 1B.

FIG. 2 is a schematic diagram of a main surface of the dispersion plate 116. The dispersion plate 116 illustrated in FIG. 2 includes a center portion 130 of the dispersion plate and a peripheral portion 132 of the dispersion plate. The center portion 130 of the dispersion plate is provided with no gas hole and is provided to face a gas introduction port of the first gas pipe 120 in the upper electrode 110 connected to the electrode surface of the upper electrode 110. The peripheral portion 132 of the dispersion plate is provided with a plurality of gas holes.

Note that the shower plate 118 is provided with a plurality of gas holes, and the number of gas holes of the shower plate 118 is preferably larger than the number of gas holes of the dispersion plate 116. Alternatively, the shower plate 118 is provided with a plurality of gas holes, and the total area of the gas holes of the shower plate 118 is preferably larger than the total area of the gas holes of the dispersion plate 116. This is because gas can be diffused sufficiently uniformly.

As described above, the center portion 130 of the dispersion plate 116 is provided with no gas hole; therefore, it is possible to prevent introduction of gas introduced from the gas introduction port of the first gas pipe 120 into the first gas diffusion area 106 without sufficient diffusion and to increase the uniformity of gas introduced into the treatment room 102.

Figure 3:
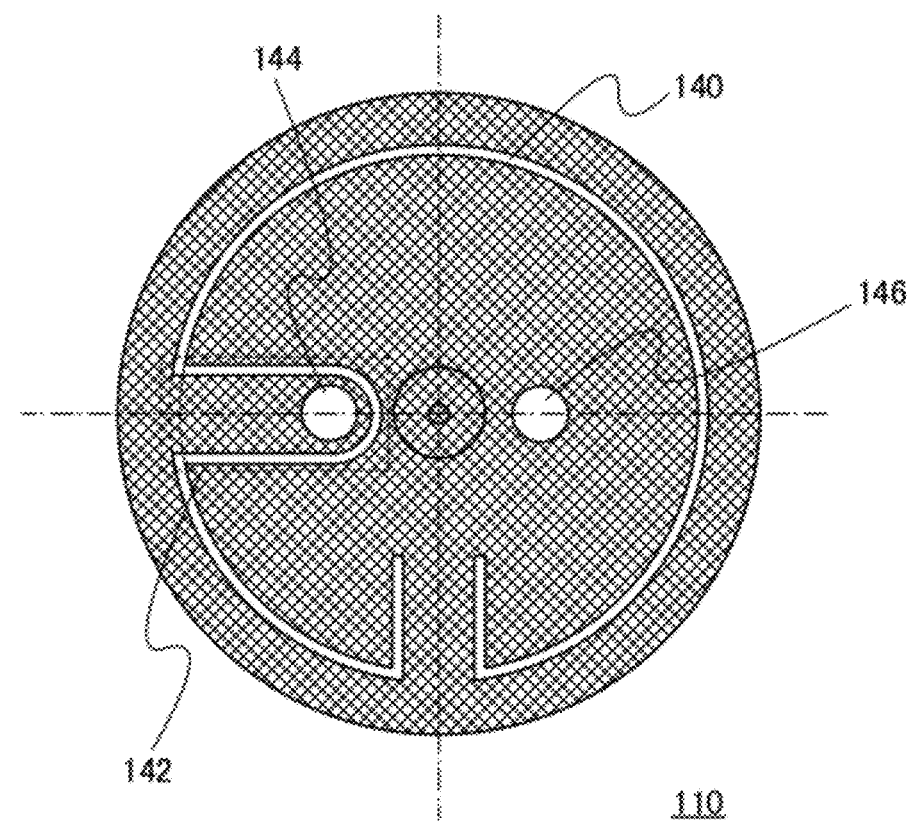
FIG. 3 is a schematic view of an electrode surface of an upper electrode of the plasma CVD apparatus in FIGS. 1A and 1B.

FIG. 3 illustrates an example of the electrode surface of the upper electrode 110. Note that FIG. 3 is a diagram of the electrode surface of the upper electrode 110, which is seen from the opposite side of the lower electrode 112. The upper electrode 110 illustrated in FIG. 3 is provided with a gas introduction port 144 of the first gas pipe 120, a connection portion 146 of the thermometer 128, and a cooling medium path 140, and the cooling medium path 140 includes a bypass portion 142 in the vicinity of the gas introduction port 144 of the first gas pipe 120.

The connection portion 146 of the thermometer 128 is preferably located to be symmetrical to the gas introduction port 144 of the first gas pipe 120 in the upper electrode 110 with respect to the center point of the electrode surface of the upper electrode 110. This is because the thermometer can be connected to the upper electrode 110 without reducing the uniformity of an electric field applied from the upper electrode 110.

The bypass portion 142 is preferably provided in the vicinity of the gas introduction port 144 of the first gas pipe 120. As the cooling medium, for example, water, oil, or the like can be used.

Note that the cooling medium path 140 is not limited to the embodiment illustrated in FIG. 3. Therefore, the bypass portion 142 is not necessarily provided.

The diameter d1 of a cross section of a main portion of the first gas pipe 120 and the diameter d2 of a cross section of a main portion of the second gas pipe 122 are set to a length with which electric discharge is not caused in the first gas pipe 120 or the second gas pipe 122 when power is supplied to the upper electrode 110. In addition, d1 and d2 are preferably substantially the same.

When an angle formed between the electrode surface of the upper electrode 110 and the first gas pipe 120 is θ, the diameter d3 of the gas introduction port of the first gas pipe 120 is represented by $d3 = d1/\sin \theta$. Note that the diameter of the first gas pipe 120 may be enlarged in the gas introduction port.

Note that the diameter d3 of the gas introduction port of the first gas pipe 120 is also set to a length with which electric discharge is not caused.

The diameter d4 of the center portion 130 of the dispersion plate is preferably larger than the diameter d3 of the gas introduction port of the first gas pipe 120. This is because gas introduced from the gas introduction port of the first gas pipe 120 is prevented from being introduced into the first gas diffusion area 106 without diffusion.

Figure 4A:
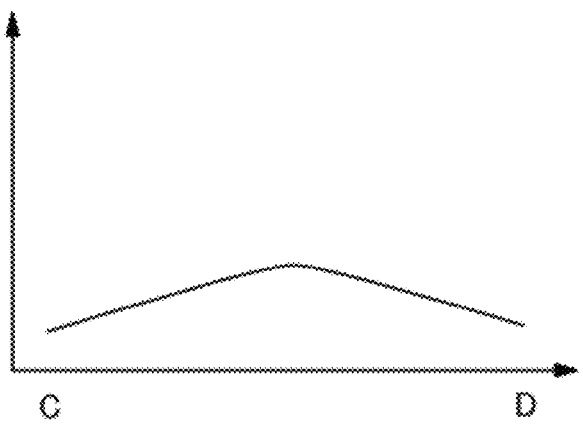
FIGS. 4A to 4C are conceptual views of electric field intensity or the like in the plasma CVD apparatus in FIGS. 1A and 1B.
Figure 4B:
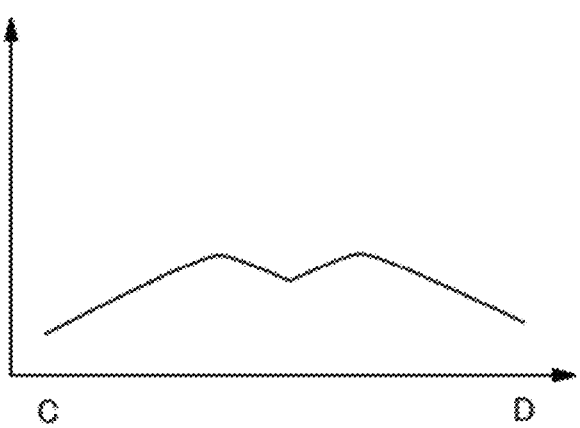
Figure 4C:
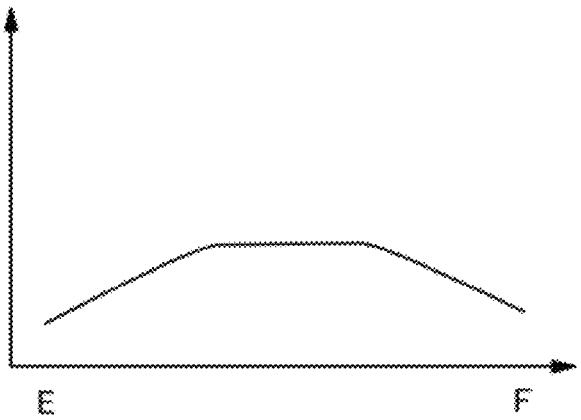

FIGS. 4A to 4C are conceptual graphs of distribution of electric field intensity along line C-D (FIG. 4A), distribution of a process gas along line C-D (FIG. 4B), and distribution of a reactive substance along line E-F (FIG. 4C), when a process gas is introduced into the treatment room 102 in the plasma treatment apparatus 100 in FIGS. 1A and 1B and voltage is applied to the upper electrode 110 and the lower electrode 112.

As shown in FIG. 4A, the electric field intensity has a peak in a position overlapped with the center portions of the upper electrode 110 and the lower electrode 112; however, the gradient is gentle because the uniformity of the electric field intensity is high in the plasma treatment apparatus 100 illustrated in FIGS. 1A and 1B. As shown in FIG. 4B, the distribution of the process gas has two peaks in a position which does not overlap with the center portion 130 of the dispersion plate.

It can be considered from the distribution of the electric field intensity shown in FIG. 4A and the distribution of the process gas shown in FIG. 4B that the reaction substance (ionized material substance) is distributed as shown in FIG. 4C. In the case where the reaction substance (ionized material substance) is distributed as shown in FIG. 4C, for example, when film formation is performed over a substrate by a plasma CVD method using the plasma treatment apparatus 100, a variation in the film thickness in a substrate plane can be reduced and the uniformity in the film quality can be increased. Alternatively, in a case other than the case where film formation is performed, plasma treatment with high uniformity can be performed on a substrate.

Note that the manufacturing method of a crystalline semiconductor film of this embodiment may be performed under a pressure of greater than or equal to 2000 Pa and less than or equal to 100000 Pa, preferably greater than or equal to 4000 Pa and less than or equal to 50000 Pa.

As described above, by using the plasma CVD apparatus shown in FIGS. 1A and 1B, the uniformity of the plasma can be increased, so that crystal nuclei of the crystalline semiconductor film with high uniformity can be formed over the substrate.

Embodiment 2

In this embodiment, a manufacturing method of a semiconductor device of one embodiment of the present invention will be described. Specifically, a method for manufacturing a thin film transistor, to which the manufacturing method of a crystalline semiconductor film described in Embodiment 1 is applied, will be described with reference to FIGS. 5A to 5D and FIGS. 6A to 6D. As a thin film transistor, a pixel transistor is given as an example.

Figure 5A:
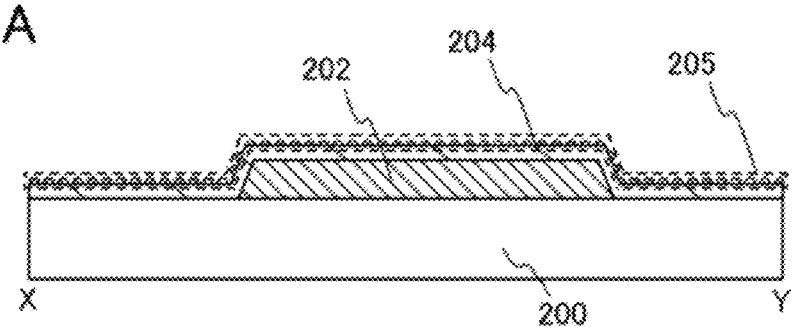
FIGS. 5A to 5D illustrate a manufacturing method of a semiconductor device of one embodiment of the present invention.

First, a first conductive layer 202 is formed over a substrate 200, and a first insulating layer 204 is formed to cover the first conductive layer 202 (FIG. 5A).

The substrate 200 is an insulating substrate. As the substrate 200, as well as a glass substrate, a quartz substrate, and a ceramic substrate, a plastic substrate or the like with heat resistance that is high enough to withstand a process temperature in this manufacturing process can be used, for example. In the case where the substrate 200 is a glass substrate, any of the substrate of the first generation (e.g., 320 mm×400 mm) to the tenth generation (e.g., 2950 mm×3400 mm) may be used; however, the substrate is not limited thereto. Note that the employment of the manufacturing method of a crystalline semiconductor film of one embodiment of the present invention described in Embodiment 1 makes it possible to suppress a reduction and variation in size of a crystal grain of a semiconductor film in a substrate surface and a variation in the thickness of the semiconductor film in a substrate surface; thus, variations in the characteristics and thickness of a semiconductor layer in the substrate surface can be suppressed. The effect of the present invention is notable particularly in the case where a large-sized substrate of the eighth generation or later is used.

The first conductive layer 202 may be formed in such a manner that, for example, a conductive film (e.g., a metal film or a semiconductor film to which an impurity element imparting one conductivity type is added) is formed by a sputtering method, an etching mask is formed over the conductive film, and selective etching is performed thereon. Alternatively, an ink-jet method or the like may be used. Note that the conductive film which serves as the first conductive layer 202 may be formed to have either a single-layer structure or a layered structure including a plurality of layers. For example, the conductive film may be formed to have a three-layer structure in which an Al layer is sandwiched between Ti layers. Note that the first conductive layer 202 forms at least a scan line and a gate electrode.

As the first insulating layer 204, for example, a film may be formed using an insulating material (e.g., silicon nitride, silicon nitride oxide, silicon oxynitride, or silicon oxide) by a plasma CVD method. Note that the first insulating layer 204 may be formed to have either a single-layer structure or a layered structure including a plurality of layers. A two-layer structure in which a silicon oxynitride layer is stacked over a silicon nitride layer is employed here, for example. The first insulating layer 204 forms at least a gate insulating layer.

The substance "silicon nitride oxide" includes more nitrogen than oxygen in composition, and preferably includes oxygen, nitrogen, silicon, and hydrogen at concentrations ranging from 5 at. % to 30 at. %, 20 at. % to 55 at. %, 25 at. % to 35 at. %, and 10 at. % to 30 at. % respectively according to the measurements using Rutherford backscattering spectrometry (RBS) and hydrogen forward scattering (HFS).

The substance "silicon oxynitride" includes more oxygen than nitrogen in composition, and preferably includes oxygen, nitrogen, silicon, and hydrogen at 50 at. % to 70 at. %, 0.5 at. % to 15 at. %, 25 at. % to 35 at. %, and 0.1 at. % to 10 at. % respectively according to the measurements using RBS and HFS.

Note that percentages of nitrogen, oxygen, silicon, and hydrogen fall within the ranges given above, where the total number of atoms included in the silicon oxynitride or the silicon nitride oxide is defined as 100 at. %.

Next, a plurality of crystal nuclei 205 is formed over the first insulating layer 204 (FIG. 5A). The plurality of crystal nuclei 205 is formed by a method described in Embodiment 1. By forming the plurality of crystal nuclei 205 by the method described in Embodiment 1, the crystal nuclei of a crystalline semiconductor can be formed uniformly over the formation surface. Note that plasma treatment using gas (e.g., $N_2O$) including oxide is preferably performed before the formation of the crystal nuclei 205.

Figure 5B:
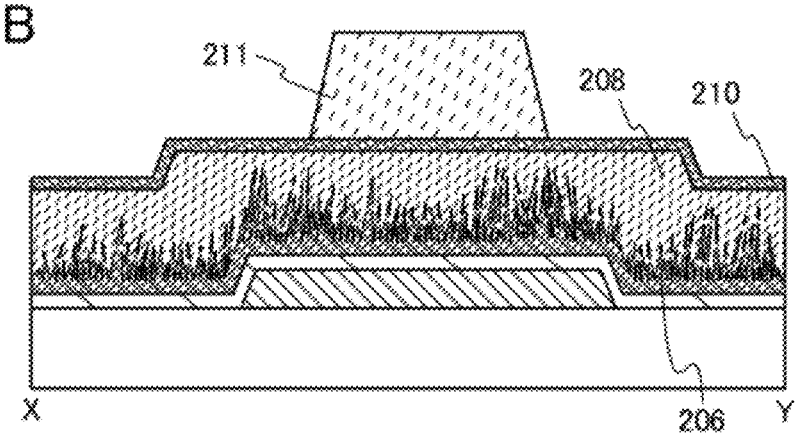

Next, the crystal nuclei 205 are grown so that a first semiconductor film 206 is formed. A second semiconductor film 208 and an impurity semiconductor film 210 are formed over the first semiconductor film 206 (FIG. 5B).

The first semiconductor film 206 is a semiconductor film most part of which is crystalline. As a crystalline semiconductor, a microcrystalline semiconductor can be given, for example. Here, a microcrystalline semiconductor is a semiconductor having an intermediate structure between amorphous and crystalline structures (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of greater than or equal to 2 nm and less than or equal to 200 nm, preferably greater than or equal to 10 nm and less than or equal to 80 nm, more preferably more than or equal to 20 nm and less than or equal to 50 nm have grown in a direction of the normal to the substrate surface. Thus, crystal grain boundaries are formed at the interface of the columnar or needle-like crystal grains in some cases. Note that the diameter of the grain here means a maximum diameter of a crystal grain in a plane parallel to the substrate surface. Further, the crystal grain includes an amorphous semiconductor region and a crystallite which is a minute crystal that can be regarded as a single crystal. The crystal grain includes a twin crystal in some cases.

Microcrystalline silicon may be used as the microcrystalline semiconductor. Microcrystalline silicon, which is one of the microcrystalline semiconductors, has a peak of the Raman spectrum which is shifted to the wave number side lower than 520 cm$^{-1}$ that represents single crystal silicon. That is, the peak of the Raman spectrum of microcrystalline silicon is within the range from 520 cm$^{-1}$ which represents single crystal silicon to 480 cm$^{-1}$ which represents amorphous silicon. In addition, the microcrystalline silicon includes hydrogen or halogen at at least 1 at. % in order to terminate a dangling bond. Moreover, a rare gas element such as He, Ar, Kr, or Ne may be included in the microcrystalline silicon to further promote lattice distortion, so that the stability is increased and a favorable microcrystalline semiconductor can be obtained.

The crystallinity can be improved when the concentration of oxygen and nitrogen (a value measured by a secondary ion mass spectrometry method) included in a crystalline semiconductor film is lowered, preferably to lower than $1 \times 10^{18}$ cm$^{-3}$.

The second semiconductor film 208 is a semiconductor film most part of which is amorphous and serving as a buffer layer. The second semiconductor film 208 is preferably a semiconductor film including an amorphous semiconductor and a minute semiconductor crystal grain, having lower energy at the Urbach edge, which is measured by a constant photocurrent method (CPM) or photoluminescence spectrometry, and having a smaller quantity of absorption spectra of defects, as compared to a conventional amorphous semiconductor film. As compared to the conventional amorphous semiconductor film, such a semiconductor film is a well-ordered semiconductor film which has few defects and a steep tail slope of a level at a band edge (mobility edge) in the valence band.

The second semiconductor film 208 may include halogen and/or nitrogen. When nitrogen is included, nitrogen may be included as an NH group or an NH$_2$ group.

Note that here, an interface region between the first semiconductor film 206 and the second semiconductor film 208 has microcrystalline semiconductor regions and an amorphous semiconductor region filling the space between the microcrystalline semiconductor regions. Specifically, the interface region between the first semiconductor film 206 and the second semiconductor film 208 includes a microcrystalline semiconductor region which extends in a conical or pyramidal shape from the first semiconductor film 206 and "a film including an amorphous semiconductor" which is similar to the second semiconductor film 208.

A buffer layer is formed using the second semiconductor film 208, whereby the off-state current of a transistor can be reduced. Further, since the interface region has the conical or pyramidal microcrystalline semiconductor regions, resistance in the vertical direction (film thickness direction), that is, resistance between the second semiconductor film 208 and a source region or a drain region formed using the impurity semiconductor film 210, can be lowered. Thus, the on-state current of the transistor can be increased. That is to say, as compared to the case of using the conventional amorphous semiconductor, the off-state current can be reduced sufficiently and the reduction in the on-state current can be suppressed; thus, switching characteristics of the transistor can be improved.

Note that as a first semiconductor layer formed using the first semiconductor film 206 is thinner in the transistor, the on-state current of the transistor is decreased. As the first semiconductor layer formed using the first semiconductor film 206 is thicker in the transistor, the off-state current of the transistor is increased because the area where the first semiconductor layer formed using the first semiconductor film 206 is in contact with a second conductive layer formed later is increased. Consequently, to increase the on/off ratio, it is preferable to form the first semiconductor film 206 to have a large thickness and further to perform insulation treatment on side surfaces of a thin film stack 212 including the first semiconductor layer formed using the first semiconductor film 206.

Most part of the above microcrystalline semiconductor region preferably includes a crystal grain having a conical or pyramidal shape whose top gets narrower from the first semiconductor film 206 toward the second semiconductor film 208. Alternatively, the most part of the microcrystalline semiconductor region preferably includes a crystal grain whose top gets wider from the first semiconductor film 206 toward the second semiconductor film 208.

When the microcrystalline semiconductor region includes a crystal grain having a conical or pyramidal shape whose top gets narrower from the first semiconductor film 206 toward the second semiconductor film 208 in the above interface region, the proportion of the microcrystalline semiconductor region on the first semiconductor film 206 side is higher than that on the second semiconductor film 208 side. The microcrystalline semiconductor region grows from a surface of the first semiconductor film 206 in the film thickness direction. When the flow rate of hydrogen with respect to that of a deposition gas (e.g., silane) in a source gas is low (that is, the dilution ratio is low) or the concentration of a source gas including nitrogen is high, crystal growth of the microcrystalline semiconductor region is suppressed, and thus, a crystal grain comes to have a conical or pyramidal shape, and most part of the semiconductor formed by the deposition is amorphous.

The interface region preferably includes nitrogen, in particular, an NH group or an NH$_2$ group. This is because defects are reduced and carriers flow easily when nitrogen, in particular, an NH group or an NH$_2$ group is bonded with dangling bonds of silicon atoms at an interface of a crystal included in the microcrystalline semiconductor region or at the interface between the microcrystalline semiconductor region and the amorphous semiconductor region. Thus, when the interface region includes nitrogen, preferably an NH group or an $NH_2$ group at a concentration of $1\times10^{20}$ cm$^{-3}$ to $1\times10^{21}$ cm$^{-3}$, dangling bonds of silicon atoms can be easily cross-linked with nitrogen, preferably an NH group or an $NH_2$ group, so that carriers can flow more easily. As a result, a bond which promotes the carrier transfer is formed at a crystal grain boundary or a defect, whereby the carrier mobility of the interface region is increased. Therefore, the field effect mobility of the transistor is improved.

Further, when the concentration of oxygen in the interface region is reduced, the defect density at the interface between the microcrystalline semiconductor region and the amorphous semiconductor region or the interface between crystal grains can be reduced, so that bonds inhibiting carrier transfer can be reduced.

The impurity semiconductor film 210 is formed using a semiconductor to which an impurity element imparting one conductivity type is added. In the case where the transistor is an n-channel transistor, for example, silicon to which P or As is added is given as a semiconductor to which an impurity element imparting one conductivity type is added. In the case where the transistor is a p-channel transistor, for example, it is possible to add B as the impurity element imparting one conductivity type; however, it is preferable to use an n-channel transistor. Therefore, silicon to which P is added is used here as an example. The impurity semiconductor film 210 may be formed using an amorphous semiconductor or a crystalline semiconductor such as a microcrystalline semiconductor.

When the impurity semiconductor film 210 is formed of an amorphous semiconductor, the flow rate of a dilution gas is higher than or equal to that of a deposition gas and lower than or equal to 10 times that of the deposition gas, preferably higher than or equal to that of the deposition gas and lower than or equal to 5 times that of the deposition gas. On the other hand, when the impurity semiconductor film 210 is formed of a crystalline semiconductor, the flow rate of the dilution gas is higher than or equal to 10 times that of a deposition gas and lower than or equal to 2000 times that of the deposition gas, preferably higher than or equal to 50 times that of the deposition gas and lower than or equal to 200 times that of the deposition gas.

Note that it is preferable that the process from and including the step of forming the first insulating layer 204 to and including the step of forming the impurity semiconductor film 210 be performed successively in the same chamber. This is for the purpose of preventing impurities from being included in any interface between the first insulating layer 204 and the impurity semiconductor film 210.

Figure 5C:
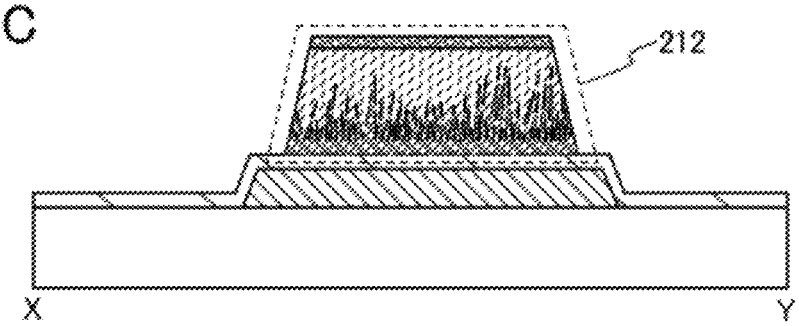

Next, an etching mask 211 is formed over the impurity semiconductor film 210, and the first semiconductor film 206, the second semiconductor film 208, and the impurity semiconductor film 210 are etched using the etching mask 211. After that, the etching mask 211 is removed. In this manner, the thin film stack 212 can be obtained (FIG. 5C). The etching mask 211 may be formed using a resist material.

Note that here, as described above, it is preferable to perform insulation treatment to the side surfaces of the thin film stack 212. That is because the off-state current increases when the first semiconductor layer and the second conductive layer of the transistor are in contact with each other in many cases. Here, for the insulation treatment, the side surfaces of the thin film stack 212 may be exposed to oxygen plasma or nitrogen plasma. Alternatively, the insulation treatment may be performed as follows: an insulating film is formed while the side surfaces of the thin film stack 212 are exposed, and the insulating film is etched in the direction perpendicular to a surface of the substrate 200 by a method for etching with high anisotropy, so that side wall insulating layers are formed in contact with the side surfaces of the thin film stack 212.

Figure 5D:
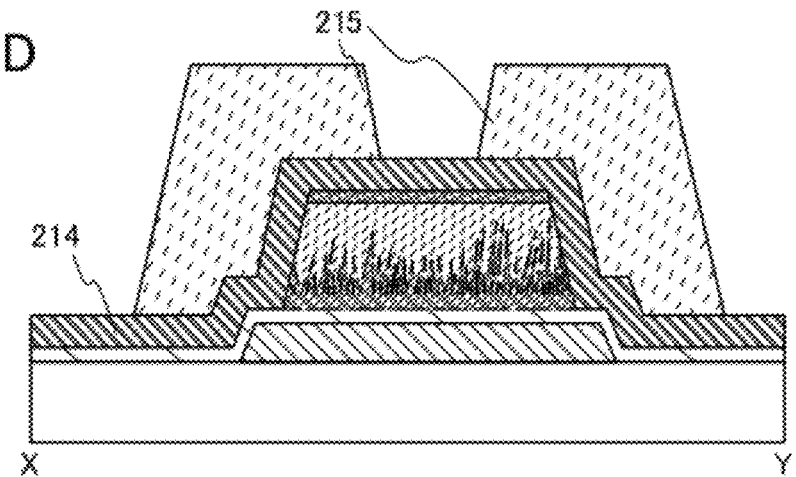

Next, a conductive film 214 is formed over the first insulating layer 204 and the thin film stack 212. An etching mask 215 is formed over the conductive film 214 (FIG. 5D).

The conductive film 214 may be formed of a conductive material (e.g., metal or a semiconductor to which an impurity element imparting one conductivity type is added) in a manner similar to that of the first conductive layer 202. Note that the conductive film 214 may have a single-layer structure or a layered structure including plural layers. For example, the conductive film 214 may be formed to have a three-layer structure in which an Al layer is sandwiched between Ti layers.

Figure 6A:
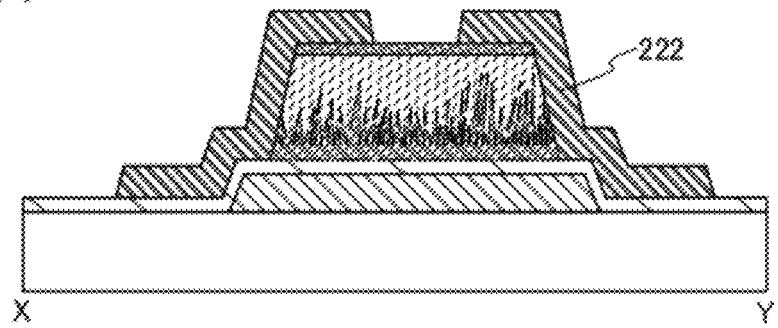
FIGS. 6A to 6D illustrate a manufacturing method of a semiconductor device of one embodiment of the present invention.

Next, the conductive film 214 is etched with the use of the etching mask 215, so that a second conductive layer 222 is formed (FIG. 6A). Then, the etching mask 215 is removed. Note that the second conductive layer 222 forms at least a signal line and a source and drain electrodes.

Figure 6B:
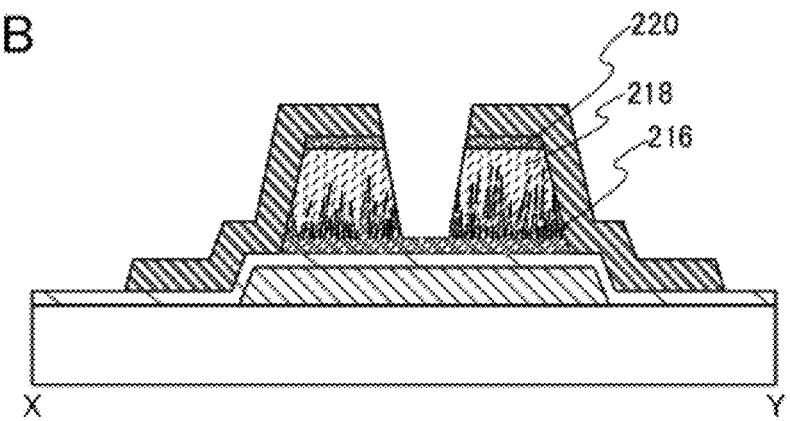

Next, the thin film stack 212 is etched using the second conductive layer 222 as an etching mask. Here, the etching is preferably performed with the use of a mixed gas of a Br-based gas, an F-based gas, and an oxygen gas. With the use of the mixed gas of a Br-based gas, an F-based gas, and an oxygen gas, an etching rate of the crystalline semiconductor film can be low and an etching rate of the amorphous semiconductor film can be high. That is, when the first semiconductor film 206 is a crystalline semiconductor film and the second semiconductor film 208 is an amorphous semiconductor film, the etching selectivity of a layer formed of the second semiconductor film 208 to a layer formed of the first semiconductor film 206 can be high. Even in the case where part of the second semiconductor film 208, which does not overlap with the second conductive layer 222, is removed to expose part of the layer formed using the first semiconductor film 206, which does not overlap with the second conductive layer 222, a reduction in the thickness of part of a first semiconductor layer 216, which does not overlap with the second conductive layer 222, can be suppressed. With these steps, the first semiconductor layer 216, a second semiconductor layer 218, and an impurity semiconductor layer 220 are formed (FIG. 6B).

An HBr gas can be given as an example of the Br-based gas, and an $SF_6$ gas, a $CF_4$ gas or an $NF_3$ gas can be given as an example of the F-based gas. Note that the etching with the use of a mixed gas may be performed with the use of the etching mask 215.

Then, the above-described exposed first semiconductor layer 216 is preferably exposed to $H_2O$ plasma. Alternatively, plasma generated by a mixed gas of hydrogen and oxygen is preferably used instead of $H_2O$ plasma.

Through the above steps, the transistor can be manufactured. Such a transistor can be applied to a pixel transistor used in a pixel of a display device.

Figure 6C:
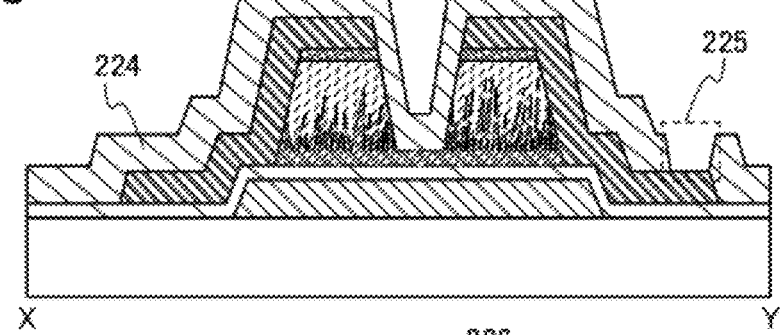

In the case of using the transistor as a pixel transistor, a second insulating layer 224 is formed to cover these layers. Note that the second insulating layer 224 is formed to cover at least the exposed portion of the first semiconductor layer 216. Then, an opening portion 225 is formed in the second insulating layer 224 (FIG. 6C).

An etching mask is formed over the second insulating layer 224 and etching is performed, so that the opening portion 225 is formed.

Figure 6D:
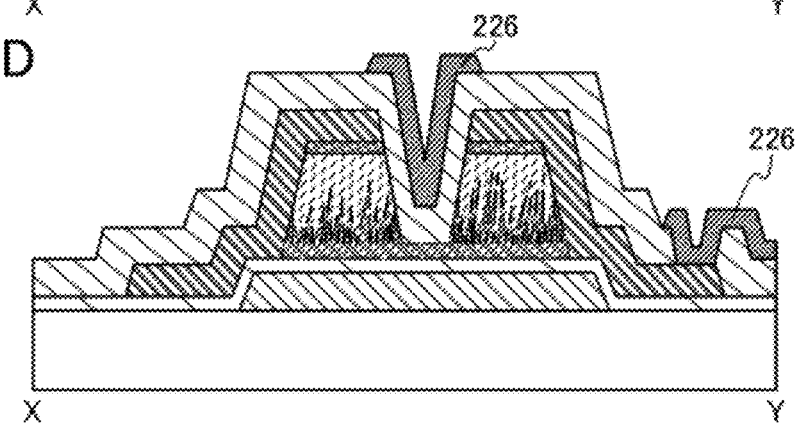

Next, a third conductive layer 226 is selectively formed so as to be electrically connected to one of the source and drain electrodes formed using the second conductive layer 222 through the opening portion 225 (FIG. 6D).

The third conductive layer 226 is preferably formed of a light-transmitting material because the third conductive layer 226 forms a pixel electrode connected to the pixel transistor. A conductive film is formed over the second insulating layer 224, an etching mask is formed over the conductive film, and etching is performed thereon, so that the third conductive layer 226 is formed.

The third conductive layer 226 can be formed using a conductive composition including a conductive high molecule (also referred to as a conductive polymer) having a light-transmitting property. It is preferable that the third conductive layer 226 formed using the conductive composition have a sheet resistance of less than or equal to 10000 Ω/square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a "π electron conjugated conductive high molecule" can be used. For example, polyaniline or a derivative thereof, polypyrrole or a derivative thereof, polythiophene or a derivative thereof, and a copolymer of two or more of aniline, pyrrole, and thiophene or a derivative thereof can be given.

The third conductive layer 226 can be formed using, for example, indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, indium tin oxide to which silicon oxide is added, or the like.

Although not shown, an insulating layer formed of an organic resin by a spin coating method or the like may be provided between the second insulating layer 224 and the third conductive layer 226.

Note that the above-described thin film transistor in this embodiment is a preferable embodiment, but one embodiment of this present invention is not limited thereto. For example, the second semiconductor film 208 does not necessarily include a minute semiconductor crystal grain.

As described above, the thin film transistor can be manufactured. According to this embodiment, the size of the crystal grains of the crystalline semiconductor film can be increased, and the crystalline semiconductor film with high carrier mobility can be obtained. Consequently, a semiconductor device with high field effect mobility can be manufactured.

Note that a manufacturing method of a semiconductor device of one embodiment of the present invention is not limited to the method described in this embodiment as long as a crystalline semiconductor film can be formed over a formation surface by the method described in Embodiment 1.

Embodiment 3

The thin film transistor described in Embodiment 2 is provided with the third conductive layer 226 to overlap with the channel formation regions. The third conductive layer 226 functions as a back gate electrode. In this embodiment, a method for providing a back gate electrode for a thin film transistor will be described.

FIGS. 7A to 7D each illustrate a top view of a thin film transistor provided with a back gate electrode. Note that a cross-sectional structure of the thin film transistor is similar to that in Embodiment 2.

Figure 7A:
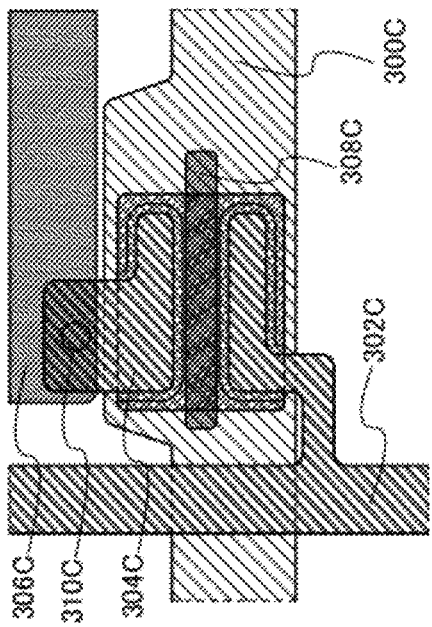
FIGS. 7A to 7D each illustrate a semiconductor device of one embodiment of the present invention.

First, as illustrated in FIG. 7A, a back gate 308A can be formed so as not to be electrically connected to a gate 300A but to be electrically independent from the gate 300A. By arranging the back gate 308A as illustrated in FIG. 7A, a potential supplied to the back gate 308A and a potential supplied to the gate 300A can be controlled to be independent from each other. Thus, the threshold voltage of the thin film transistor can be controlled. Further, a region where carriers flow is formed in both the gate side and the back gate side of a channel formation region formed using a first semiconductor layer, so that the on-state current of the thin film transistor can be increased.

Note that the gate 300A illustrated in FIG. 7A is a gate electrode and a gate wiring and is formed using the first conductive layer 202 in Embodiment 2.

Note that a wiring 302A illustrated in FIG. 7A is a source electrode and a source wiring and is formed using the second conductive layer 222 in Embodiment 2.

Note that an electrode 304A illustrated in FIG. 7A is a drain electrode and is formed using the second conductive layer 222 in Embodiment 2.

Note that a pixel electrode 306A illustrated in FIG. 7A is a pixel electrode and is formed using the third conductive layer 226 in Embodiment 2.

Note that the back gate 308A illustrated in FIG. 7A is a back gate electrode and a back gate wiring and is formed using the third conductive layer 226 in Embodiment 2.

Note that an opening portion 310A illustrated in FIG. 7A corresponds to the opening portion 225 in Embodiment 2.

Figure 7B:
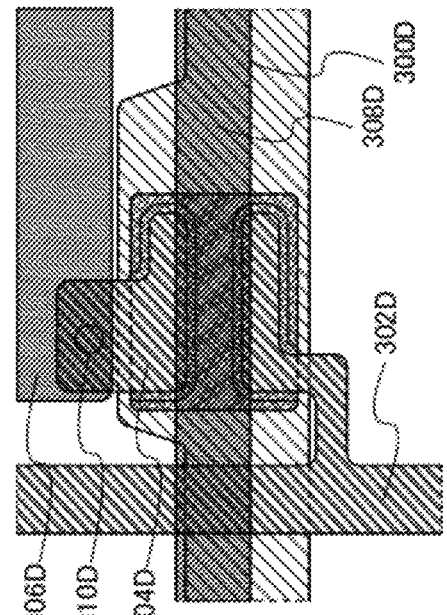

As illustrated in FIG. 7B, a back gate may be electrically connected to a gate. In FIG. 7B, a gate 300B is electrically connected to a back gate 308B in an opening portion 312. Thus, the potential of the gate is substantially equal to the potential of the back gate. Consequently, similarly to FIG. 7A, a region where carriers flow is formed in both the gate side and the back gate side of a channel formation region formed using a first semiconductor layer, so that the on-state current of the thin film transistor can be increased.

Note that the gate 300B illustrated in FIG. 7B is a gate electrode and a gate wiring and is formed using the first conductive layer 202 in Embodiment 2.

Note that a wiring 302B illustrated in FIG. 7B is a source electrode and a source wiring and is formed using the second conductive layer 222 in Embodiment 2.

Note that an electrode 304B illustrated in FIG. 7B is a drain electrode and is formed using the second conductive layer 222 in Embodiment 2.

Note that a pixel electrode 306B illustrated in FIG. 7B is a pixel electrode and is formed using the third conductive layer 226 in Embodiment 2.

Note that the back gate 308B illustrated in FIG. 7B is a back gate electrode and is formed using the third conductive layer 226 in Embodiment 2.

Note that an opening portion 310B illustrated in FIG. 7B corresponds to the opening portion 225 in Embodiment 2.

Note that the opening portion 312 illustrated in FIG. 7B is formed in the same step as the step of the opening portion 225 in Embodiment 2. In the opening portion 312, the gate 300B and the back gate 308B are connected with each other.

Figure 7C:
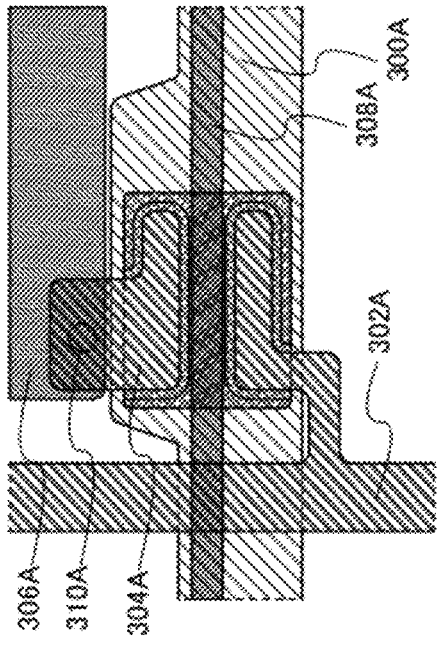

As illustrated in FIG. 7C, a back gate may be in a floating state without electrically connecting to a gate electrode and without leading independently.

Note that a gate 300C illustrated in FIG. 7C is a gate electrode and a gate wiring and is formed using the first conductive layer 202 in Embodiment 2.

Note that a wiring 302C illustrated in FIG. 7C is a source electrode and a source wiring and is formed using the second conductive layer 222 in Embodiment 2.

Note that an electrode 304C illustrated in FIG. 7C is a drain electrode and is formed using the second conductive layer 222 in Embodiment 2.

Note that a pixel electrode 306C illustrated in FIG. 7C is a pixel electrode and is formed using the third conductive layer 226 in Embodiment 2.

Note that a back gate 308C illustrated in FIG. 7C is a back gate electrode and is formed using the third conductive layer 226 in Embodiment 2.

Note that an opening portion 310C illustrated in FIG. 7C corresponds to the opening portion 225 in Embodiment 2.

Figure 7D:
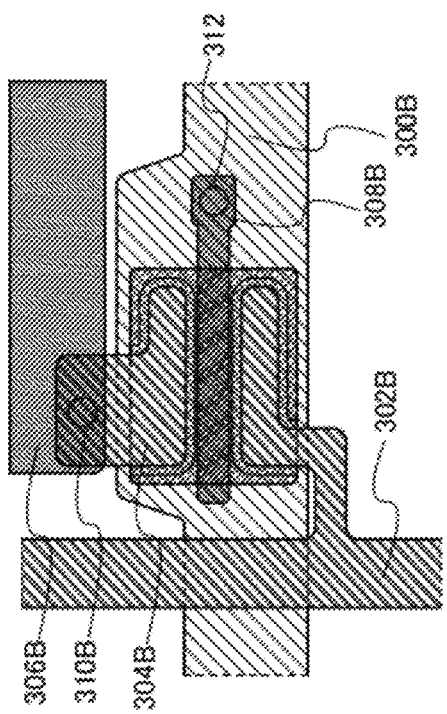

As illustrated in FIG. 7D, a back gate may be provided to overlap with a source electrode and a drain electrode. Here, a thin film transistor having the structure illustrated in FIG. 7A is described; however, the back gates illustrated in FIGS. 7B and 7C may each overlap with a source electrode and a drain electrode formed using the second conductive layer 222 in a manner similar to that in FIG. 7D.

Note that a gate 300D illustrated in FIG. 7D is a gate electrode and a gate wiring and is formed using the first conductive layer 202 in Embodiment 2.

Note that a wiring 302D illustrated in FIG. 7D is a source electrode and a source wiring and is formed using the second conductive layer 222 in Embodiment 2.

Note that an electrode 304D illustrated in FIG. 7D is a drain electrode and is formed using the second conductive layer 222 in Embodiment 2.

Note that a pixel electrode 306D illustrated in FIG. 7D is a pixel electrode and is formed using the third conductive layer 226 in Embodiment 2.

Note that a back gate 308D illustrated in FIG. 7D is a back gate electrode and a back gate wiring and is formed using the third conductive layer 226 in Embodiment 2.

Note that an opening portion 310D illustrated in FIG. 7D corresponds to the opening portion 225 in Embodiment 2.

Embodiment 4

As a semiconductor device to which the thin film transistor manufactured in the above embodiment is applied, electronic paper can be given. Electronic paper can be used for electronic appliances of a variety of fields as long as they can display data. For example, electronic paper can be applied to an electronic book reader (e-book), a poster, a digital signage, a public information display (PID), an advertisement in a vehicle such as a train, displays of various cards such as a credit card, and the like. An example of such electronic appliances is illustrated in FIG. 8.

Figure 8:
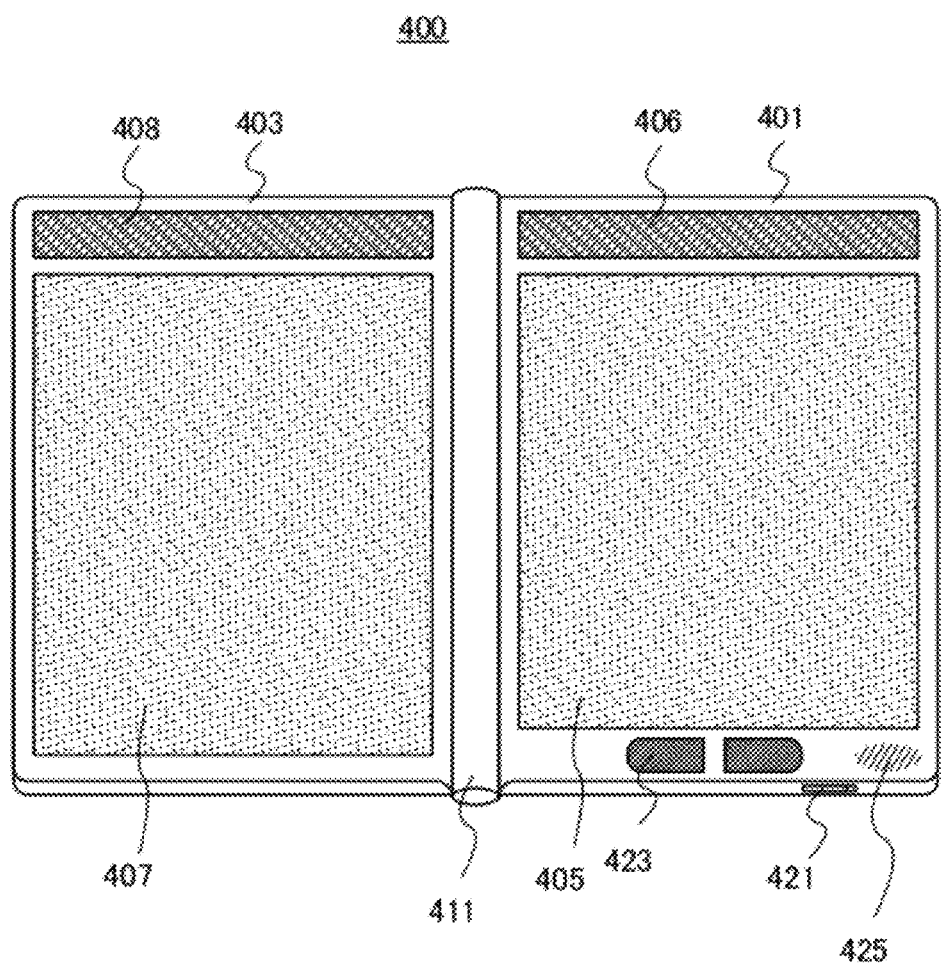
FIG. 8 illustrates a semiconductor device of one embodiment of the present invention.

FIG. 8 illustrates an example of an electronic book reader. For example, an electronic book reader 400 includes two housings 401 and 403. The housings 401 and 403 are combined with each other with a hinge 411 so that the electronic book reader 400 can be opened and closed with the hinge 411 as an axis. With such a structure, the electronic book reader 400 can be handled like a paper book.

A display portion 405 and a photoelectric conversion device 406 are incorporated in a housing 401. A display portion 407 and a photoelectric conversion device 408 are incorporated in a housing 403. The display portions 405 and 407 may display one image or different images. In the case where the display portions 405 and 407 display different images, for example, a display portion on the right side (the display portion 405 in FIG. 8) can display text and a display portion on the left side (the display portion 407 in FIG. 8) can display images.

FIG. 8 illustrates an example in which the housing 401 includes an operation portion and the like. For example, the housing 401 includes a power source 421, operation keys 423, a speaker 425, and the like. Pages can be turned by the operation keys 423. Note that a keyboard, a pointing device, or the like may also be provided on the surface of the housing, on which the display portion is provided. Furthermore, an external connection terminal (an earphone terminal, a USB terminal, a terminal that can be connected to an AC adapter, various cables such as a USB cable, or the like), a recording medium insertion portion, and the like may be provided on the back surface or the side surface of the housing. Furthermore, the electronic book reader 400 may function as an electronic dictionary.

Further, the electronic book reader 400 may transmit and receive data wirelessly. Through wireless communication, desired book data or the like can be purchased and downloaded from an electronic book server.

Embodiment 5

As the semiconductor device to which the thin film transistor manufactured in the above embodiment is applied, various electronic appliances (including amusement machines) can be given, in addition to electronic paper. Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 9A:
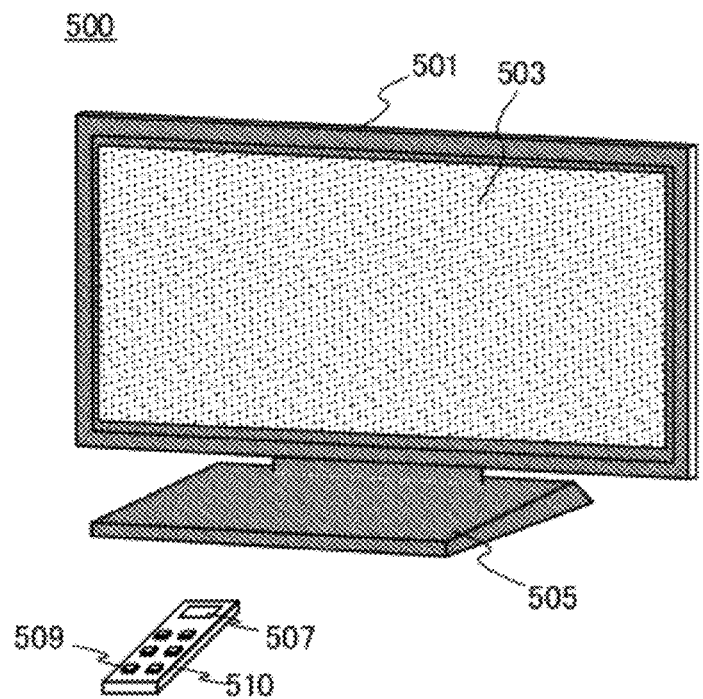
FIGS. 9A and 9B each illustrate a semiconductor device of one embodiment of the present invention.

FIG. 9A illustrates an example of a television set. In a television set 500, a display portion 503 is incorporated in a housing 501. Images can be displayed on the display portion 503. Here, the housing 501 is supported by a stand 505.

The television set 500 can be operated by an operation switch of the housing 501 or a separate remote controller 510. Channels can be switched and volume can be controlled with operation keys 509 of the remote controller 510, whereby an image displayed on the display portion 503 can be controlled. The remote controller 510 may be provided with a display portion 507 for displaying data output from the remote controller 510.

Note that the television set 500 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 9B:
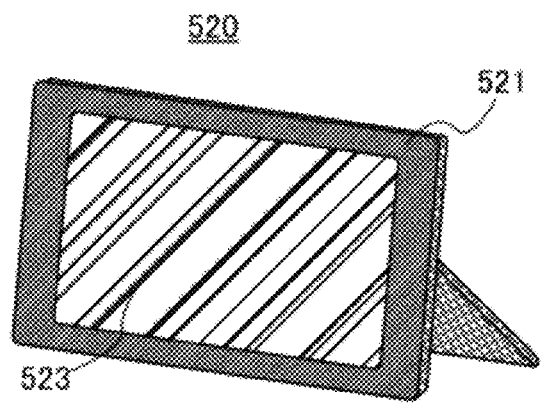

FIG. 9B illustrates an example of a digital photo frame. For example, a display portion 523 is incorporated in a housing 521 of a digital photo frame 520. The display portion 523 can display a variety of images. For example, the display portion 523 can display data of an image taken with a digital camera or the like and function as a normal photo frame.

Note that the digital photo frame 520 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 520. For example, a memory storing data of an image taken with a digital camera is inserted into the storage medium inserting portion of the digital photo frame and the image data is imported, whereby the imported image data can be displayed on the display portion 523.

The digital photo frame 520 may have a structure capable of wirelessly transmitting and receiving data. The structure may be employed in which desired image data is transferred wirelessly to be displayed.

Figure 10:
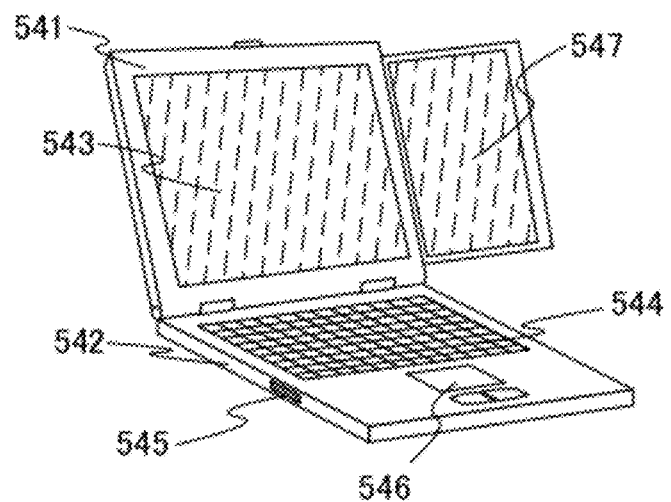
FIG. 10 illustrates a semiconductor device of one embodiment of the present invention.

FIG. 10 is a perspective view illustrating an example of a portable computer.

In the portable computer of FIG. 10, a top housing 541 having a display portion 543 and a bottom housing 542 having a keyboard 544 can overlap with each other by closing a hinge unit which connects the top housing 541 and the bottom housing 542. The portable computer of FIG. 10 can be convenient for carrying, and in the case of using the keyboard for input, the hinge unit is opened and the user can input looking at the display portion 543.

The bottom housing 542 has a pointing device 546 with which input can be performed, in addition to the keyboard 544. When the display portion 543 is a touch screen, input can be performed by touching part of the display portion 543. The bottom housing 542 includes an arithmetic function portion such as a CPU or hard disk. In addition, the bottom housing 542 has an external connection port 545 into which another device, for example, a communication cable compliant with communication standards of a USB is inserted.

The top housing 541 further includes a display portion 547 which can be kept in the top housing 541 by being slid therein. Thus, a large display screen can be realized. In addition, the user can adjust the orientation of a screen of the display portion 547 which can be kept in the top housing 541. When the display portion 547 which can be kept in the top housing 541 is a touch screen, input can be performed by touching part of the display portion 547 which can be kept in the top housing 541.

The display portion 543 or the display portion 547 which can be kept in the top housing 541 is formed with an image display device of a liquid crystal display panel, a light-emitting display panel such as an organic light-emitting element or an inorganic light-emitting element, or the like.

In addition, the portable computer illustrated in FIG. 10 can include a receiver and the like and can receive a TV broadcast to display images on the display portion. The user can watch a television broadcast when the whole screen of the display portion 547 is exposed by sliding the display portion 547 and the angle of the screen is adjusted while the hinge unit which connects the top housing 541 and the bottom housing 542 is kept closed. In this case, the hinge unit is not opened and display is not performed on the display portion 543. In addition, start up of only a circuit for displaying television broadcast is performed. Therefore, power consumption can be the minimum, which is useful for the portable computer whose battery capacity is limited.

Example 1

In this example, Sample 1 which is Comparative Sample in which crystal nuclei were formed using a conventional plasma CVD apparatus, and Sample 2 which is Example Sample in which crystal nuclei were formed using a plasma CVD apparatus shown in FIGS. 1A and 1B were manufactured and compared.

In the conventional plasma CVD apparatus for manufacturing Sample 1, not only the peripheral portion of the dispersion plate but also the center portion of the dispersion plate were preferably provided with a plurality of gas holes, an upper electrode and a chamber wall were not provided on the same axis, a connecting portion of a thermometer was provided so as not to be symmetrical to a gas introduction port of a first gas pipe in the upper electrode with respect to the center point of the electrode surface of the upper electrode.

In each of the conventional plasma CVD apparatus and the plasma CVD apparatus shown in FIGS. 1A and 1B, first, a 200-nm-thick silicon nitride film was formed over a glass substrate by a plasma CVD method. Specifically, a monosilane gas, an ammonia gas, a nitrogen gas, and a hydrogen gas were introduced at 15 sccm, 500 sccm, 180 sccm, and 200 sccm respectively into a treatment room where the substrate was placed; the pressure in the treatment room was set at 100 Pa; the distance between an upper electrode and a lower electrode in the treatment room was set at 26 mm; and high-frequency power with a frequency of 13.56 MHz and an electrical power of 200 W was supplied to the upper electrode. Note that the temperature of the upper electrode was set at 200° C. and the temperature of the lower electrode was set at 300° C.

Next, plasma treatment was performed on a surface of the silicon nitride film. Specifically, a dinitrogen monoxide ($N_2O$) gas was introduced at 400 sccm into the treatment room where the substrate was placed; the pressure in the treatment room was set at 60 Pa; the distance between the upper electrode and the lower electrode which were provided in the treatment room was set at 30 mm; and high-frequency power with a frequency of 13.56 MHz and an electrical power of 300 W was supplied to the upper electrode. Note that the temperature of the upper electrode was set at 200° C. and the temperature of the lower electrode was set at 300° C.

The silicon nitride film which was subjected to the plasma treatment served as a formation surface of crystal nuclei.

Next, crystal nuclei were formed over the formation surface in Sample 1. Specifically, a monosilane gas, an argon gas, and a hydrogen gas were introduced at 2.5 sccm, 750 sccm, and 750 sccm respectively into the treatment room where the substrate was placed; the pressure in the treatment room was set at 3000 Pa; the distance between the upper electrode and the lower electrode in the treatment room was set at 7 mm; and high-frequency power with a frequency of 13.56 MHz and an electrical power of 175 W was supplied to the upper electrode. Note that the temperature of the upper electrode was set at 200° C. and the temperature of the lower electrode was set at 300° C. A conventional plasma CVD apparatus was used for film formation.

Crystal nuclei were also formed over the formation surface in Sample 2. Specifically, a monosilane gas, an argon gas, and a hydrogen gas were introduced at 2.5 sccm, 750 sccm, and 750 sccm respectively into the treatment room where the substrate was placed; the pressure in the treatment room was set at 3000 Pa; the distance between the upper electrode and the lower electrode in the treatment room was set at 7 mm; and high-frequency power with a frequency of 13.56 MHz and an electrical power of 175 W was supplied to the upper electrode. Note that the temperature of the upper electrode was set at 0° C. and the temperature of the lower electrode was set at 300° C. A plasma CVD apparatus in FIGS. 1A and 1B was used for film formation.

Figure 11:
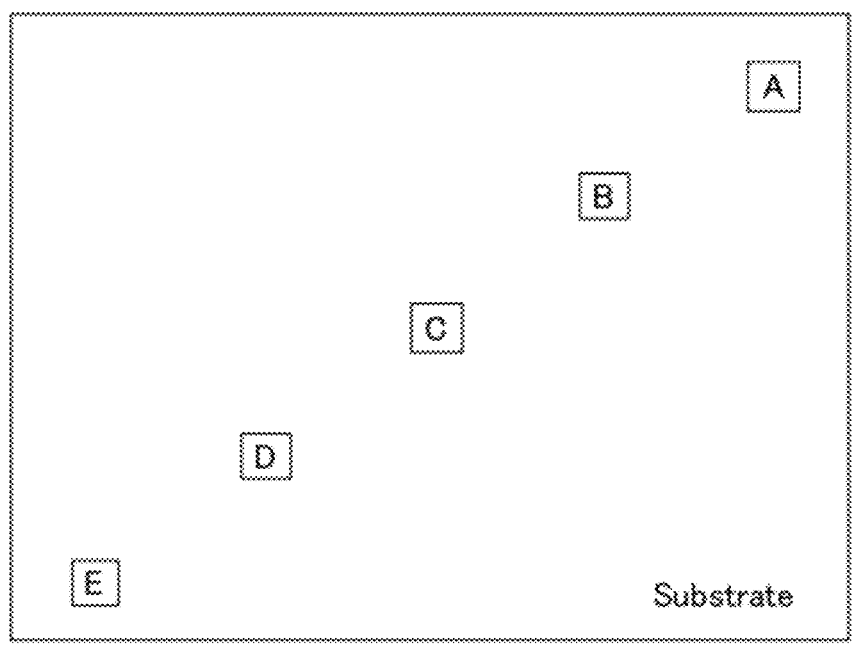
FIG. 11 illustrates points at which an SEM image described in Example 1 is obtained.

Sample 1 and Sample 2 were each observed at five points of the substrate shown in FIG. 11 with a scanning electron microscopy (SEM). That is, the upper right portion of the substrate is referred to as a region A, the center portion of the substrate is referred to as a region C, the lower left portion of the substrate is referred to as a region E, a region between the region A and the region C is referred to as a region B, a region between the region C and the region E is referred to as a region D.

Figure 12A:
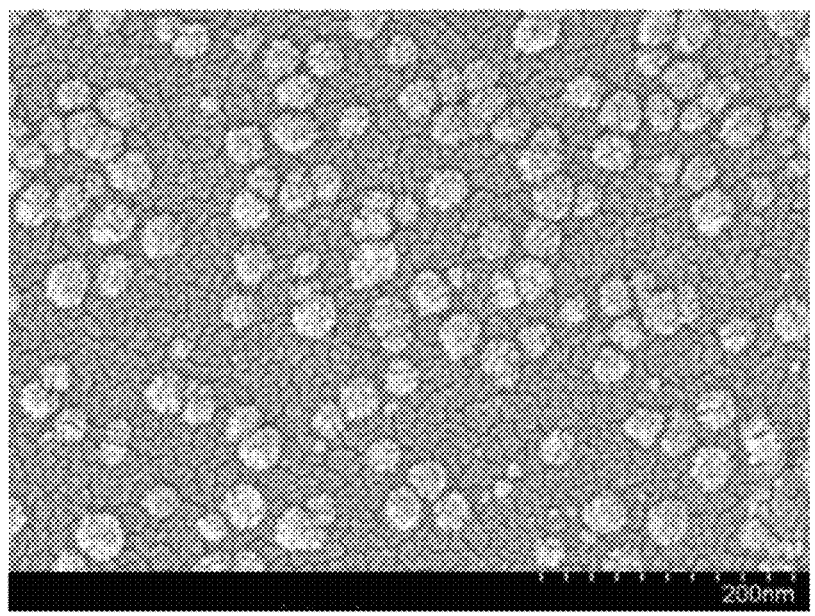
FIGS. 12A and 12B are each an SEM image of Comparative Sample described in Example 1.
Figure 12B:
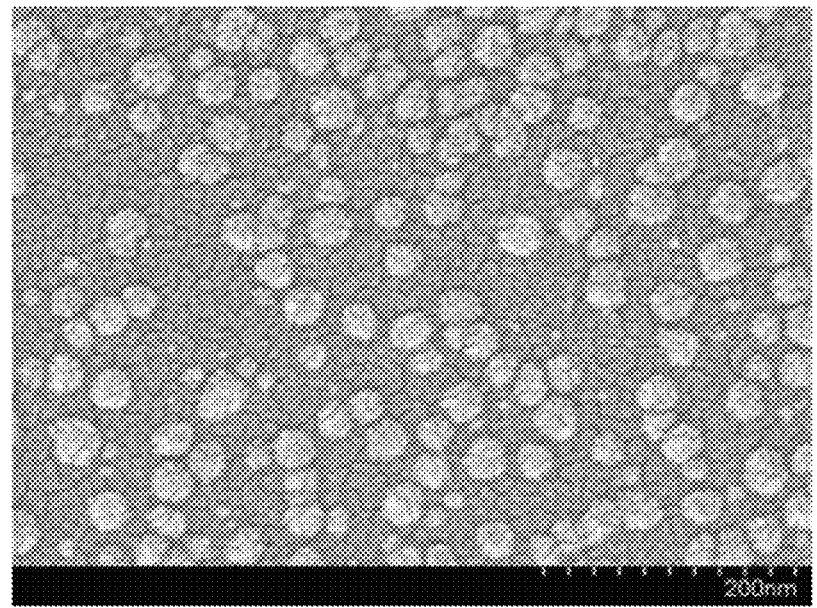
Figure 13A:
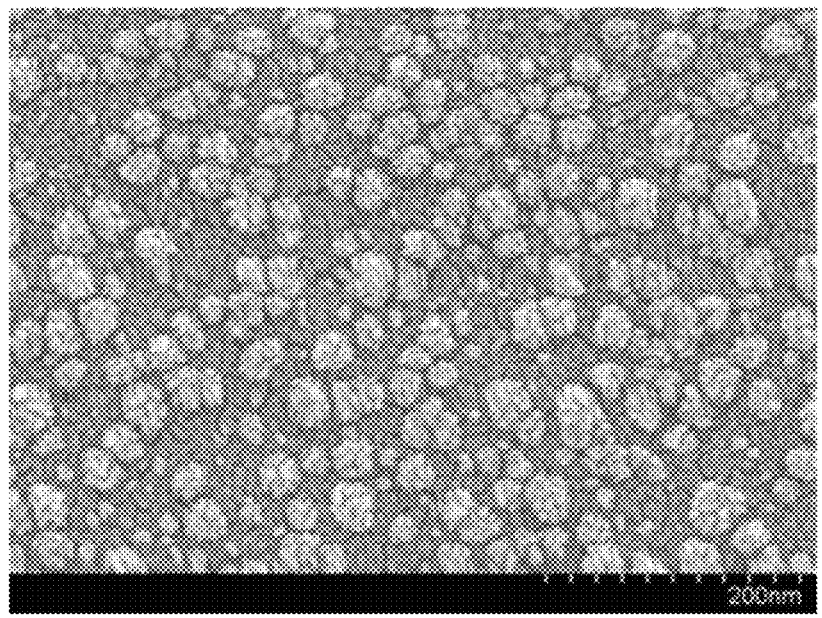
FIGS. 13A and 13B are each an SEM image of Comparative Sample described in Example 1.
Figure 13B:
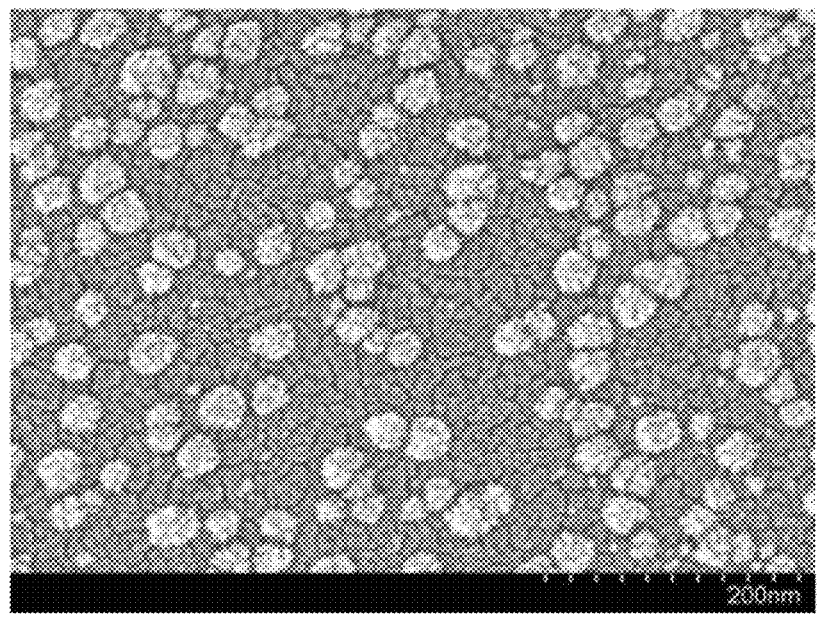
Figure 14:
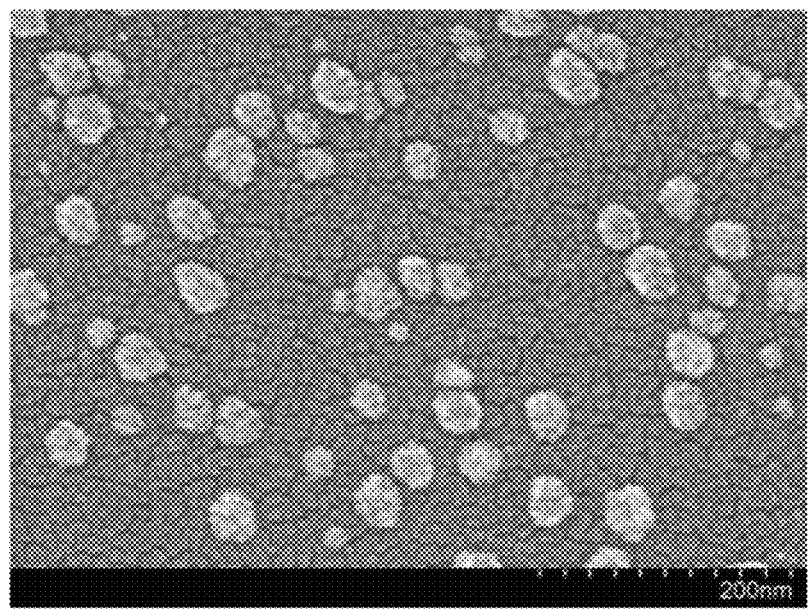
FIG. 14 is an SEM image of Comparative Sample described in Example 1.
Figure 15A:
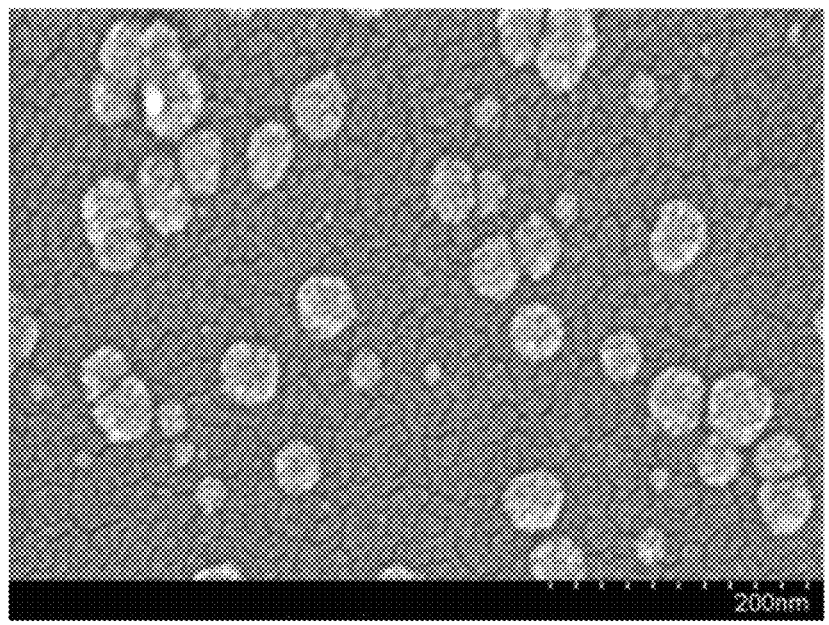
FIGS. 15A and 15B are each an SEM image of Example Sample described in Example 1.
Figure 15B:
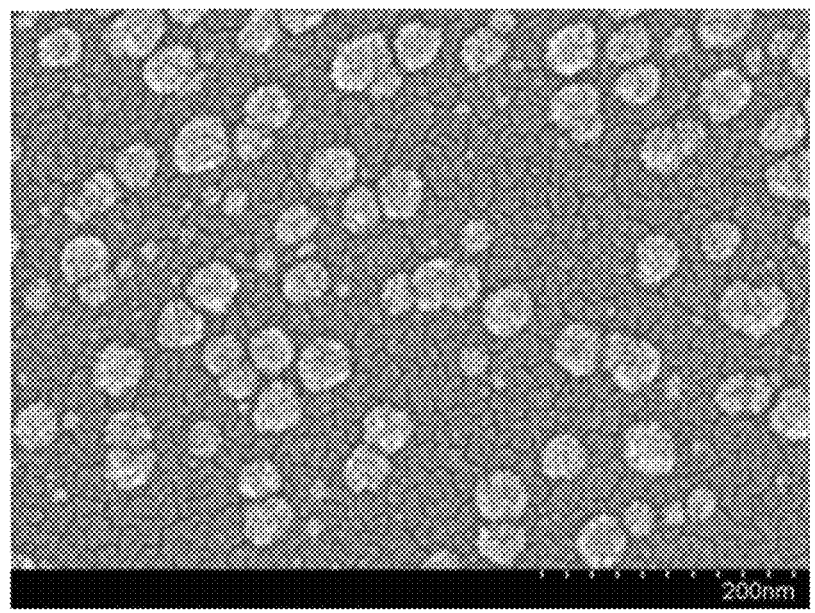
Figure 16A:
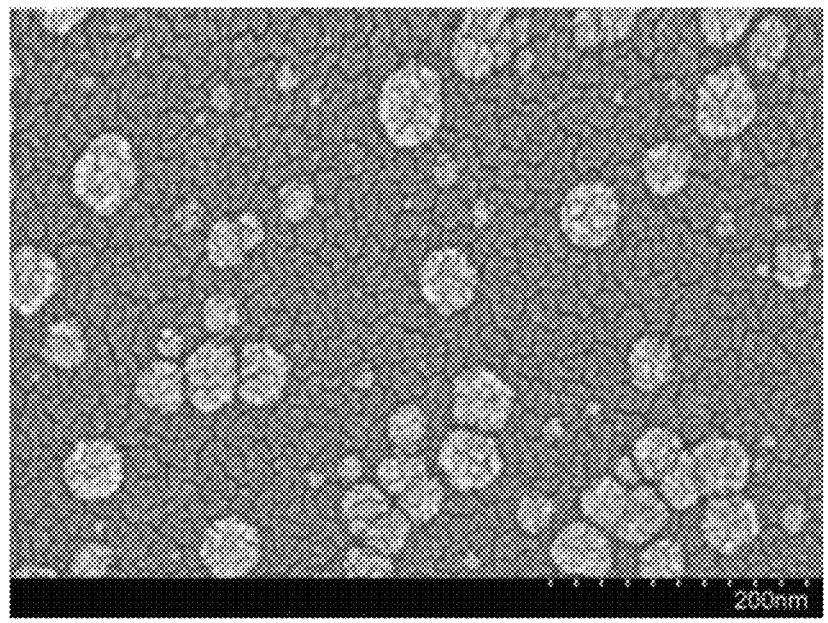
FIGS. 16A and 16B are each an SEM image of Example Sample described in Example 1.
Figure 16B:
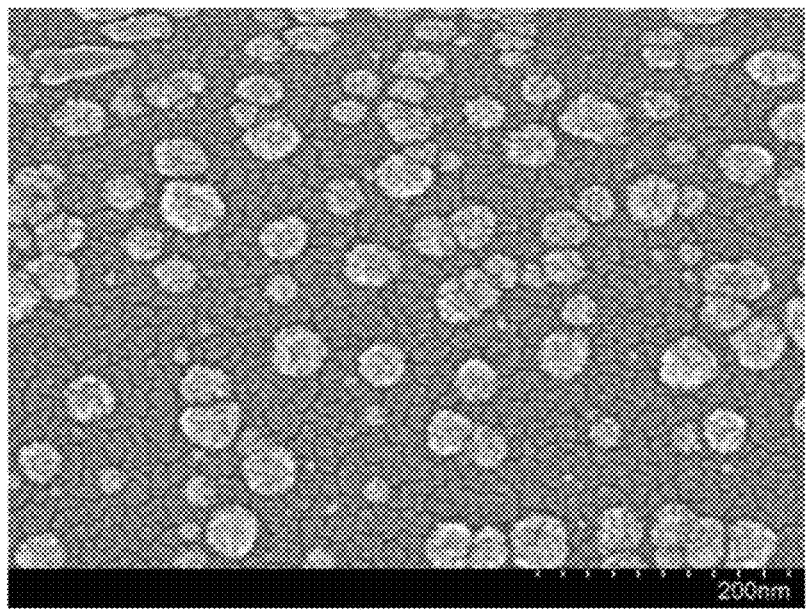
Figure 17:
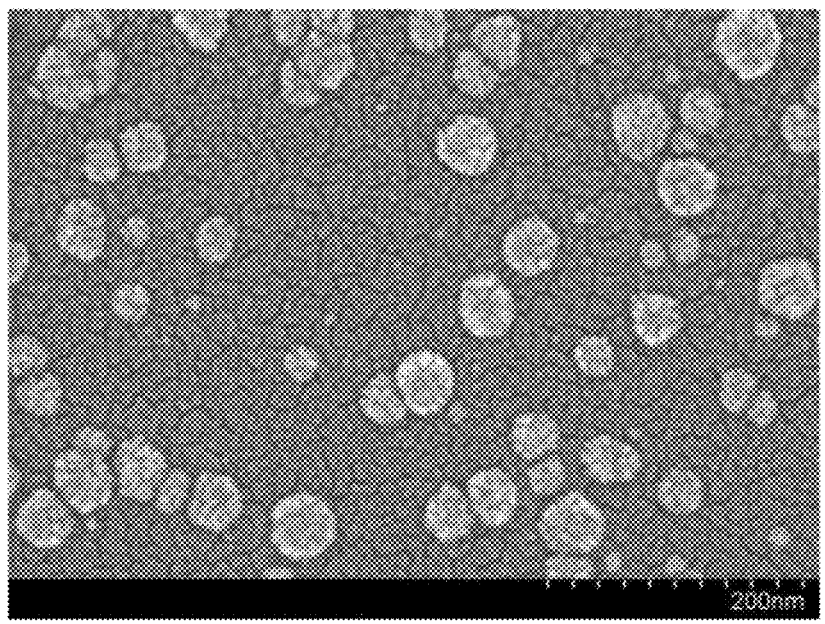
FIG. 17 is an SEM image of Example Sample described in Example 1.

FIG. 12A is a SEM image at the region A of Sample 1. FIG. 12B is a SEM image at the region B of Sample 1. FIG. 13A is a SEM image at the region C of Sample 1. FIG. 13B is a SEM image at the region D of Sample 1. FIG. 14 is a SEM image at the region E of Sample 1. FIG. 15A is a SEM image at the region A of Sample 2. FIG. 15B is a SEM image at the region B of Sample 2. FIG. 16A is a SEM image at the region C of Sample 2. FIG. 16B is a SEM image at the region D of Sample 2. FIG. 17 is a SEM image at the region E of Sample 2.

As shown in the SEM images of FIGS. 12A and 12B, FIGS. 13A and 13B, and FIG. 14, in Sample 1 which is Comparative Sample, many minute crystal nuclei were formed. Further, for example, according to the comparison between the region C and the region E, even though many minute crystal nuclei were formed in the region C, the size of the crystal nuclei formed in the region E was larger than that in the region C, and the number of the crystal nuclei formed in the region E was smaller than that in the region C. As seen from this, Sample 1 which is Comparative Sample had large variations in the size and number of crystal nuclei in the substrate surface.

On the other hand, as shown in the SEM images of FIGS. 15A and 15B, FIGS. 16A and 16B, and FIG. 17, the size of the crystal nuclei formed in Sample 2 which is Example Sample was larger than that in Sample 1 and the number of the crystal nuclei formed in Sample 2 was smaller than that in Sample 1. Further, the sizes of the crystal nuclei formed in all of the regions A to E were approximately the same, and a variation in number of the crystal nuclei formed was small.

Here, the film thicknesses of Sample 1 and Sample 2 were measured with the use of spectroscopic ellipsometer (manufactured by Full Automatic Spectroscopic Elipsometer UT-300; HORIBA, Ltd). The film thicknesses were measured at 25 points, and the maximum thickness ($T_{MAX.}$) and the minimum thickness ($T_{min.}$) were obtained. Further, the uniformity (referred to as Unif.) was obtained from Formula 2 using the maximum thickness ($T_{MAX.}$) and the minimum thickness ($T_{min.}$).

$$Unif. = \pm \frac{T_{MAX.} - T_{min.}}{T_{MAX.} + T_{min.}} \times 100 \quad \text{[Formula 2]}$$

According to the above Formula 2, Unif. of Sample 1 was ±10.6%, and Unif. of Sample 2 was ±2.0%. This showed that Unif. of Sample 2 was smaller than Unif. of Sample 1 (the variation was smaller), and that the uniformity of Sample 2 was higher than that of Sample 1.

Figure 18:
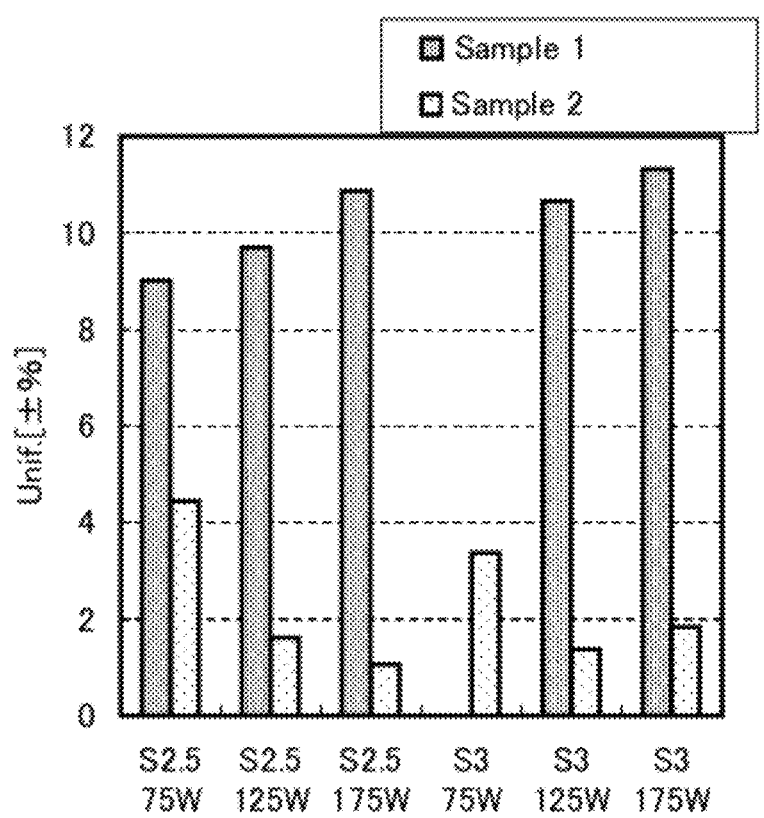
FIG. 18 is a graph of comparison of the uniformity of crystal nuclei formed in the substrate surface in Example 1.

FIG. 18 illustrates Unif. when crystal nuclei were formed with a monosilane gas at a flow rate of 2.5 sccm (S2.5) or 3 sccm (S3), and high-frequency power with a frequency of 75 W, 125 W, or 175 W. In the case where the flow rate of a monosilane gas was set to 3 sccm, the uniformity of Sample 2 tended to be higher than the uniformity of Sample 1. Further, in the case where high-frequency power was set to 75 W or 125 W, the uniformity of Sample 2 tended to be higher than the uniformity of Sample 1

As described above, by applying one embodiment of the present invention, the crystal nuclei with small variations in the size and number can be formed in the substrate surface.

This application is based on Japanese Patent Application serial no. 2010-247300 filed with Japan Patent Office on Nov. 4, 2010, the entire contents of which are hereby incorporated by reference.

What is claimed is:

1. A manufacturing method of a crystalline semiconductor film using a film formation apparatus, the film formation apparatus comprising:
   a treatment room;
   an upper electrode with a gas introduction port;
   a dispersion plate with a peripheral portion with a plurality of gas holes and a center portion with no gas hole;
   a first gas diffusion area between the upper electrode and the dispersion plate;
   a shower plate with a plurality of gas holes;
   a second gas diffusion area between the dispersion plate and the shower plate; and
   a lower electrode in the treatment room,
   wherein the center portion of the dispersion plate faces the gas introduction port,
   wherein a diameter of the center portion of the dispersion plate with no gas hole is larger than a diameter of the gas introduction port, and
   wherein the lower electrode faces the upper electrode with the dispersion plate, the first gas diffusion area, the second gas diffusion area and the shower plate interposed therebetween,
   wherein the method for forming the crystalline semiconductor film using the film formation apparatus comprising the steps of:
      supplying a film formation gas into the treatment room from the gas introduction port through the first gas diffusion area, the plurality of gas holes of the dispersion plate, the second gas diffusion area, and the plurality of gas holes of the shower plate;
      setting pressure of the treatment room at greater than or equal to 2000 Pa and less than or equal to 100000 Pa by introducing the film formation gas;
      generating glow discharge plasma by supplying high-frequency power with uniform electric field intensity from a surface of the upper electrode and generating an electric field in the treatment room;
      generating crystal nuclei on a substrate provided on the lower electrode; and
      growing the crystal nuclei generated on the substrate.

2. The manufacturing method of a crystalline semiconductor film according to claim 1, wherein a pressure in the treatment room is greater than or equal to 4000 Pa and less than or equal to 50000 Pa during a period in which the crystal nuclei are grown.

3. The manufacturing method of a crystalline semiconductor film according to claim 1, wherein the number of the gas holes in the shower plate is larger than the number of the gas holes in the dispersion plate.

4. The manufacturing method of a crystalline semiconductor film according to claim 1, wherein a total area of the gas holes in one surface of the shower plate is larger than a total area of the gas holes in one surface of the dispersion plate.

5. The manufacturing method of a crystalline semiconductor film according to claim 1, wherein a thermometer is connected to the upper electrode, and a location of connection portion of the thermometer on the upper electrode is a location that is symmetrical to an inlet of first gas pipe in the upper electrode with respect to a central point of an electrode plane of the upper electrode.

6. The manufacturing method of a crystalline semiconductor film according to claim 1, wherein the upper electrode, the first gas diffusion area, the dispersion plate, the second gas diffusion area, the shower plate, and the lower electrode are provided in a chamber wall, wherein the chamber wall and the upper electrode are provided on the same axis.

7. The manufacturing method of a crystalline semiconductor film according to claim 1,
wherein the crystal nuclei are grown so that columnar or needle-like crystals having a grain size of more than or equal to 20 nm and less than or equal to 50 nm which have grown in a direction of the normal to a surface of the substrate is formed.

8. A manufacturing method of a crystalline semiconductor film comprising the steps of:
supplying a film formation gas into a first area through a gas introduction port provided in a first electrode;
supplying the film formation gas into a second area from the first area through a plurality of holes in a first plate provided between the second area and the first area;
supplying the film formation gas into a treatment room from the second area through a plurality of holes in a second plate provided between the second area and the treatment room;
generating glow discharge plasma by supplying high frequency electricity from an electrode surface of the first electrode;
generating crystal nuclei on a substrate provided on a second electrode facing the first electrode; and
growing the crystal nuclei generated on the substrate,
wherein the first plate comprises a first portion having no holes and a second portion having the plurality of the holes,
wherein the first portion of the first plate is facing the gas introduction port, and
wherein a diameter of the first portion of the first plate having no gas hole is larger than a diameter of the gas introduction port.

9. The manufacturing method of a crystalline semiconductor film according to claim 8, wherein a pressure in the treatment room is greater than or equal to 2000 Pa and less than or equal to 100000 Pa during a period in which the crystal nuclei are grown.

10. The manufacturing method of a crystalline semiconductor film according to claim 8, wherein a pressure in the treatment room is greater than or equal to 4000 Pa and less than or equal to 50000 Pa during a period in which the crystal nuclei are grown.

11. The manufacturing method of a crystalline semiconductor film according to claim 8, wherein the number of the gas holes in the second plate is larger than the number of the gas holes in the first plate.

12. The manufacturing method of a crystalline semiconductor film according to claim 8, wherein a total area of the gas holes in one surface of the second plate is larger than a total area of the gas holes in one surface of the first plate.

13. The manufacturing method of a crystalline semiconductor film according to claim 8, wherein a thermometer is connected to the first electrode, and a location of connection portion of the thermometer on the first electrode is a location that is symmetrical to an inlet of first gas pipe in the first electrode with respect to a central point of an electrode plane of the first electrode.

14. The manufacturing method of a crystalline semiconductor film according to claim 8, wherein the first electrode, the first area, the first plate, the second area, the second plate, and the second electrode are provided in a chamber wall, wherein the chamber wall and the first electrode are provided on the same axis.

15. The manufacturing method of a crystalline semiconductor film according to claim 8,
wherein the crystal nuclei are grown so that columnar or needle-like crystals having a grain size of more than or equal to 20 nm and less than or equal to 50 nm which have grown in a direction of the normal to a surface of the substrate is formed.

16. A manufacturing method of a semiconductor device comprising the steps of:
forming a gate electrode over a substrate;
forming a gate insulating layer to cover the gate electrode;
forming a crystalline semiconductor film over the gate insulating layer; and
forming a source electrode and a drain electrode over the crystalline semiconductor film,
wherein the crystalline semiconductor film is formed by using a film formation apparatus comprises:
a treatment room;
an upper electrode with a gas introduction port;
a dispersion plate with a peripheral portion with a plurality of gas holes and a center portion with no gas hole;
a first gas diffusion area between the upper electrode and the dispersion plate;
a shower plate with a plurality of gas holes;
a second gas diffusion area between the dispersion plate and the shower plate; and
a lower electrode in the treatment room,
wherein the center portion of the dispersion plate faces the gas introduction port,
wherein a diameter of the center portion of the dispersion plate with no gas hole is larger than a diameter of the gas introduction port, and
wherein the lower electrode faces the upper electrode with the dispersion plate, the first gas diffusion area, the second gas diffusion area and the shower plate interposed therebetween, and
wherein the method for forming the crystalline semiconductor film using the film formation apparatus comprises the steps of:
supplying a film formation gas into the treatment room from the gas introduction port through the first gas diffusion area, the plurality of gas holes of the dispersion plate, the second gas diffusion area, and the plurality of gas holes of the shower plate;
setting pressure of the treatment room at greater than or equal to 2000 Pa and less than or equal to 100000 Pa by introducing the film formation gas;
generating glow discharge plasma by supplying high-frequency power with uniform electric field intensity from a surface of the upper electrode and generating an electric field in the treatment room;
generating crystal nuclei on the substrate provided on the lower electrode; and
growing the crystal nuclei generated on the substrate.

17. The manufacturing method of a semiconductor device according to claim 16, wherein a pressure in the treatment room is greater than or equal to 4000 Pa and less than or equal to 50000 Pa during a period in which the crystal nuclei are grown.

18. The manufacturing method of a semiconductor device according to claim 16, wherein the number of the gas holes in the shower plate is larger than the number of the gas holes in the dispersion plate.

19. The manufacturing method of a semiconductor device according to claim 16, wherein a total area of the gas holes in one surface of the shower plate is larger than a total area of the gas holes in one surface of the dispersion plate.

20. The manufacturing method of a semiconductor device according to claim 16, wherein a thermometer is connected to the upper electrode, and a location of connection portion of the thermometer on the upper electrode is a location that is symmetrical to an inlet of first gas pipe in the upper electrode with respect to a central point of an electrode plane of the upper electrode.

21. The manufacturing method of a semiconductor device according to claim 16, wherein the upper electrode, the first gas diffusion area, the dispersion plate, the second gas diffusion area, the shower plate, and the lower electrode are provided in a chamber wall, wherein the chamber wall and the upper electrode are provided on the same axis.

22. The manufacturing method of a semiconductor device according to claim 16,
    wherein the crystal nuclei are grown so that columnar or needle-like crystals having a grain size of more than or equal to 20 nm and less than or equal to 50 nm which have grown in a direction of the normal to a surface of the substrate is formed.

\* \* \* \* \*